United States Patent
Hoshino et al.

(10) Patent No.: US 6,484,048 B1
(45) Date of Patent: Nov. 19, 2002

(54) REAL-TIME INTERACTIVE THREE-DIMENSIONAL LOCATING AND DISPLAYING SYSTEM

(75) Inventors: Tsutomu Hoshino, Pacifica, CA (US); Shigehide Kuhara, Otawara; Junichi Makita, Tokyo, both of (JP)

(73) Assignee: Kabushiki Kaisha Toshiba, Kanagawa-Ken (JP)

( * ) Notice: Subject to any disclaimer, the term of this patent is extended or adjusted under 35 U.S.C. 154(b) by 0 days.

(21) Appl. No.: 09/422,258

(22) Filed: Oct. 21, 1999

(30) Foreign Application Priority Data

Oct. 21, 1998 (JP) .................................................. 300093

(51) Int. Cl.[7] ................................................. A61B 5/05
(52) U.S. Cl. ........................ 600/410; 600/414; 600/424; 382/128; 345/419
(58) Field of Search ................................. 600/407, 310, 600/410, 415, 414, 424, 425, 426, 431, 436, 437, 444, 450, 463, 508, 128; 382/285.1; 378/4, 6, 19, 20, 21, 44, 42; 345/419, 425

(56) References Cited

U.S. PATENT DOCUMENTS

| 4,674,046 A | 6/1987 | Ozeki et al. |
| 4,830,012 A | 5/1989 | Rlederer |
| 5,512,826 A | 4/1996 | Hardy et al. |
| 5,512,827 A | 4/1996 | Hardy et al. |
| 5,514,962 A | 5/1996 | Cline et al. |
| 5,584,293 A | 12/1996 | Darrow et al. |
| 5,719,498 A | 2/1998 | Hausmann |
| 5,871,019 A | * 2/1999 | Belohlavek .................. 600/441 |
| 5,889,524 A | * 3/1999 | Sheehan et al. ............. 345/419 |
| 5,898,305 A | 4/1999 | Kokuburn et al. |
| 6,108,573 A | 8/2000 | Debbins et al. |
| 6,215,305 B1 | 4/2001 | Haselhoff et al. |

FOREIGN PATENT DOCUMENTS

JP 6-114033 4/1994

OTHER PUBLICATIONS

Hardy et al, "Interactive Coronary MRI", MRM 40: 105–111 (1998).
Kerr et al, "Real–Time Interactive MRI on a Conventional Scanner", MRM 38: 355–367 (1997).

* cited by examiner

Primary Examiner—Marvin M. Lateef
Assistant Examiner—Jeoyuh Lin
(74) Attorney, Agent, or Firm—Nixon & Vanderhye PC

(57) ABSTRACT

An easily recognized spatial relationship between an object and a section thereof is displayed (together with a real time image of the section) to permit quick, accurate, easy and accurate selection of a desired three-dimensional position for the section. The coordinate system of an imaging system may also be concurrently displayed. In addition to sequentially pasted real time section images, a reference image acquired at an arbitrary time may also be pasted on a portion of the display. Thus a reference image and a real-time image of the scanned section can be displayed to facilitate a better spatial understanding of the position of the section being scanned and imaged.

51 Claims, 19 Drawing Sheets

9

- a. DISPLAY OF COORDINATE AXES AND 3D DISPLAY OF SPECIFIED SECTION
- b. DISPLAY OF SCANNED NEWEST IMAGE AND REFERENCE IMAGE
- c. PASTING NEWEST IMAGE ON SPECIFIED SECTION (TRANSLUCENCY PROCESSING)
- d. DISPLAY OF REFERENCE SECTION
- e. PASTING REFERENCE IMAGE ON REFERENCE SECTION (TRANSLUCENCY PROCESSING)
- f. SECTIONAL CONTROL (POSITIONAL CHANGES OF SECTIONS & CHANGES OF DISPLAY ATTRIBUTES)
- g. SECTIONAL CONTROL (CHANGES OF VIEW POSITIONS)
- h. SPECIFICATION OF POSITION IN IMAGE
- i. PROVIDING REFERENCE POSITION TO SPECIFIED SECTION
- j. STORAGE OF POSITION OF DISPLAYED SECTION & RETURN TO STORED POSITION
- k. DESCRIPTION OF ABSOLUTE POSITION OF SPECIFIED SECTION
- l. SPECIFICATION OF SECTION TO BE SCANNED
- m. DISPLAY OF VIEW LINE ARROW
- n. DISPLAY/NON-DISPLAY OF PROJECTED 3D IMAGE
- o. DYNAMIC PLANNING (MACRO FUNCTION)
- p. CONTINUOUS SCANNING USING PARAMETERS
- q. CONTINUOUS RECORDING OF SECTIONAL POSITION & REPLAY
- r. FUNCTIONS OF ENLARGEMENT & REDUCTION
- s. AUTOMATIC MEAN OPERATION

FIG. 3

| Add to presets | | | | | | | Ctrl-f |
|---|---|---|---|---|---|---|---|
| Remove the oldest | | | | | | | |
| Remove the last | | | | | | | |
| Remove all | | | | | | | |
| Save into file | | | | | | | |
| (alpha | beta | gamma) | ( dx | dy | dz) | dist | zoom |
| ( 0.0 | 0.0 | 0.0) | (-28 | 0 | 38) | 0 | 100 |
| ( 0.0 | 0.0 | 0.0) | (-28 | 0 | 72) | 0 | 100 |
| ( 0.0 | 0.0 | 0.0) | (-28 | 0 | 91) | 0 | 100 |
| ( 0.0 | 0.0 | 0.0) | (-28 | 0 | 96) | 0 | 100 |
| ( 0.0 | 0.0 | 0.0) | (-28 | 0 | 106) | 0 | 100 |
| ( 0.0 | 0.0 | 0.0) | (-28 | 0 | 110) | 0 | 100 |
| ( 0.0 | 0.0 | 0.0) | (-28 | 0 | 112) | 0 | 100 |
| ( 0.0 | 0.0 | 0.0) | (-28 | 0 | 132) | 0 | 100 |
| ( 0.0 | 0.0 | 0.0) | (-28 | 0 | 132) | 0 | 100 |
| (180.0 | 90.0 | 180.0) | (-28 | 0 | 3) | 0 | 100 |
| (180.0 | 90.0 | 180.0) | ( -3 | 0 | 3) | 0 | 100 |
| (180.0 | 90.0 | 180.0) | ( -3 | 0 | 38) | 0 | 100 |
| (180.0 | 90.0 | 180.0) | ( -3 | 0 | 38) | 0 | 100 |
| (-52.4 | 146.7 | -74.3) | (-64 | 39 | -17) | 24 | 100 |

FIG. 12

REAL-TIME INTERACTIVE THREE-DIMENSIONAL LOCATING AND DISPLAYING SYSTEM

BACKGROUND OF THE INVENTION

1. Technical Field of the Invention

The present invention relates to a three-dimensional locating and displaying system that can suitably be incorporated into such modalities as MR imaging (MRI) systems, and in particular, a three-dimensional locating and displaying system that is capable of setting sections directed to any direction in the three-dimensional image space.

2. Description of Prior Art

In general, in medical modalities such as MR imaging systems, it is frequently required that sections (or volume regions) be placed with desired angles at desired positions in a three-dimensional space, as can be seen in locating sections to be imaged, for example.

Conventional setting of such sections is performed by the following ways. One way is that a reference section is imaged and displayed into a two-dimensional image as a reference image. The reference image is then used to set a section of a region of interest containing an orthogonal vector thereto. For instance, a sagittal plane of an object is first imaged and displayed into a sagittal image as a reference image, then an oblique plane to this image, which is inclined from an axial plane, is set, before the oblique image is imaged.

Another setting way is that a section to be imaged is set, like the foregoing first setting manner, with a two-dimensional reference image being rotated and/or moved by operation to change the reference sections themselves or with an orthogonal section being set to the reference image, using MR continuous scanning (MR fluoroscopy).

A third setting way is a technique that displays a three-dimensional model in the three-dimensional space by the projection method (projection technique), and displays a sectional position existing within the model. Under this condition, using the above-described first or second setting way allows the section to move, thus helping to grasp its spatial position.

However, the above conventional first to third section-setting ways provide poor three-dimensional visibility. Thus it is frequent that positions in the screen are considerably difficult to readily grasp. In this situation, an operator may be unable to quickly understand at which position he has placed or is placing a section, resulting in an inability to select setting of desired sections for imaging in an accurate and quick fashion.

Particularly, in cases where a plane directed to an oblique direction, not perpendicular to a reference image, is set based on the first way of setting, a portion through which the plane intersects with the reference image is displayed as a segment and the remaining portion is displayed by a projected (projected) image. But his method has difficulties in spatial understanding and provides no accuracy in positioning. Even if positions in the three-dimensional space are shown by the third way of setting, an operator must consider the correspondence to a two-dimensional image displayed separately. From a viewpoint that sections should be set at desired positions, this third way of setting is unfortunately not always easy and excellent in maneuverability.

SUMMARY OF THE INVENTION

The present invention has been directed towards reducing some of the drawbacks that the foregoing conventional section setting ways possess. One object of the present invention is to provide a section setting technique capable of setting a section at desired three-dimensional positions in a speedy, accurate and easy fashion with the spatial-position relationship between an object and its region to be scanned recognized accurately.

Another object of the present invention is, with a section set according to the above manner, to display a real-time image at the region to be scanned and provide it for observation.

To achieve the above objects, a basic feature of the present invention is that a three-dimensional locating and displaying system comprises region display means for displaying at least one region placed in a three-dimensional space set within an object; image display means for displaying at the region an image at a portion of the object corresponding to the region; and change means for arbitrarily changing at least one of a direction and a position of the region in the three-dimensional space. For example, the region is a volume-like region or a sectional region. Preferably, the region display means display both the sectional region and three-dimensional absolute coordinate axes set in the three-dimensional space. Thus an operator is able to easily locate the region as observing the region residing in the three-dimensional absolute coordinate.

Particularly, one preferred example is that, the region to be scanned is a sectional region, and the system comprise scanning means for obtaining a two-dimensional image by continuously scanning (fluoroscopy) the sectional region and pasting means for pasting the two-dimensional image on the sectional region displayed in the region display means successively in real time. Thus an operator is able to set the position of a section to be scanned as understanding a spatial relationship between the operator and the section to be scanned.

According to another preferred example, there may be provided reference image display means for pasting, as a reference image, the two-dimensional image scanned at any time on another sectional region placed in the coordinate system. By referring to this reference image, an operator can grasp more easily a spatial relationship between the object and the section to be scanned, locating the section more accurately.

According to still another preferred example, there are provided specifying means for specifying a position in the three-dimensional space; and marker display means for displaying a marker in the three-dimensional space, the marker corresponding to the specified position. For example, the marker display means displays the marker in a different hue from the two-dimensional image. This makes it possible to effectively use techniques, such that a section to be scanned is moved to the position of the marker, thereby assisting the location of the section.

According to still another preferred example, the position change means are constituted by means for specifying the sectional region into a desired three-dimensional position by a moving operation, a rotary operation and a moving operation. Thus a series of images can be scanned with sections that undergo offsets continuously rotated.

Still preferably, means capable of not merely time-sequentially recording three-dimensional positions of the region in the three-dimensional space but also calling the recorded three-dimensional positions are provided. Means for time-sequentially replaying the two-dimensional image corresponding to the called three-dimensional position may also be provided.

Still, a preferable embodiment is that the position change means changes a position of the sectional region for the continuos scanning in a predetermined stylized operation. For example, the stylized operation uses, as a technique for specifying a move amount of the sectional region, a macro description with a function of time. In addition, by way of example, the position change means automatically sets, by image processing, a vector concerning a move direction of a position of the sectional region in the continuous scanning, thereby determining the position automatically. This provides an easy-to-operate-locating manner.

Further, in a preferred example, there are provided two-dimensional display means for two-dimensionally displaying the two-dimensional image; and landmark display means for displaying in the three-dimensional space a landmark indicating a direction along which the two-dimensional image is observed. This upgrades the assistance capability for locating the section.

Preferably, there are specifying means for specifying a slice direction in which the object is scanned; continuous scanning means for producing a plurality of two-dimensional images by continuously scanning an entity to be scanned containing the region of the object along the slice direction; and locating image producing means for producing from the plurality of two-dimensional images a locating reference image of the entity, the locating reference image being outlined into a three-dimensional image. For example, the locating image producing means extracts contours of the entity from a plurality of images and produces the reference image from data of the contours.

Further, preferably, there is provided a construction which includes: signal detecting means for detecting a signal expressing physiological information about the object; scanning means for scanning an entity to be scanned containing the region of the object in association with the signal of which time elapses; and signal displaying means for displaying, together with the signal, a marker indicating that an image scanned by the scanning means corresponds to which timing in the signal, wherein the image display means displays the image scanned by the scanning means synchronously with the signal displayed by the signal display means. For instance, the signal expressing physiological information about the object is an ECG signal. Additionally, a construction that both the signal display means and the image display means operates during scanning by the scanning means or at replay after the scanning by the scanning means may be provided.

Still one preferred example is to provide scanning means for continuously scanning a plurality of portions containing the region of the object; and locator providing means for providing a plurality of locators using real-time images scanned by the scanning means. By way of example, with the region being a section, the locator providing means provides each locator including one section on which the real-time image scanned by the scanning means is displayed by giving the real-time image for the image display means and the other section, intersected with the one section, on which a reference image is pasted.

Further, the three-dimensional locating and display image can be, as one example, incorporated into an MRI system.

BRIEF DESCRIPTION OF THE DRAWINGS

In the accompanying drawings:

FIG. 3 exemplifies various functions of the graphical user interface;

FIG. 12 exemplifies still another function of the graphical user interface;

DETAILED DESCRIPTION OF PREFERRED EMBODIMENTS

Hereinafter, with reference to the accompanying drawings, the embodiments of a three-dimensional locating and displaying system according to the present invention will be described.

(First Embodiment)

A three-dimensional locating and displaying system according to a first embodiment has a fundamental feature that, with a section to be scanned being three-dimensionally located in an interactive manner in the three-dimensional space set to an object, displays images of the section in an approximate real-time response. Practically, this imaging uses a technique referred to as a "crossed two-section method" by which a section to be scanned and a reference section intersecting the scan section are adopted.

This exemplary embodiment incorporates the above three-dimensional locating and displaying system as part of an MRI system. However, the present invention is not necessarily limited to such a configuration as may other variations may be practiced as the present invention. The system can be formed as an independent system configuration connected to an MRI system through a communication line, or the system may be integrally or independently combined into other medical modalities capable of acquiring three-dimensional image data, such as an x-ray CT scanner and a 3D ultrasound diagnostic apparatus. Further, the system may be. a system in which a plurality of medical modalities, for example, an MRI system and a 3D ultrasound diagnostic apparatus, are combined for practicing the invention. In short, the systems that call for real-time setting of sections to be scanned (regions to be scanned) at desired positions in the three-dimensional space become objective systems.

Figure 1:
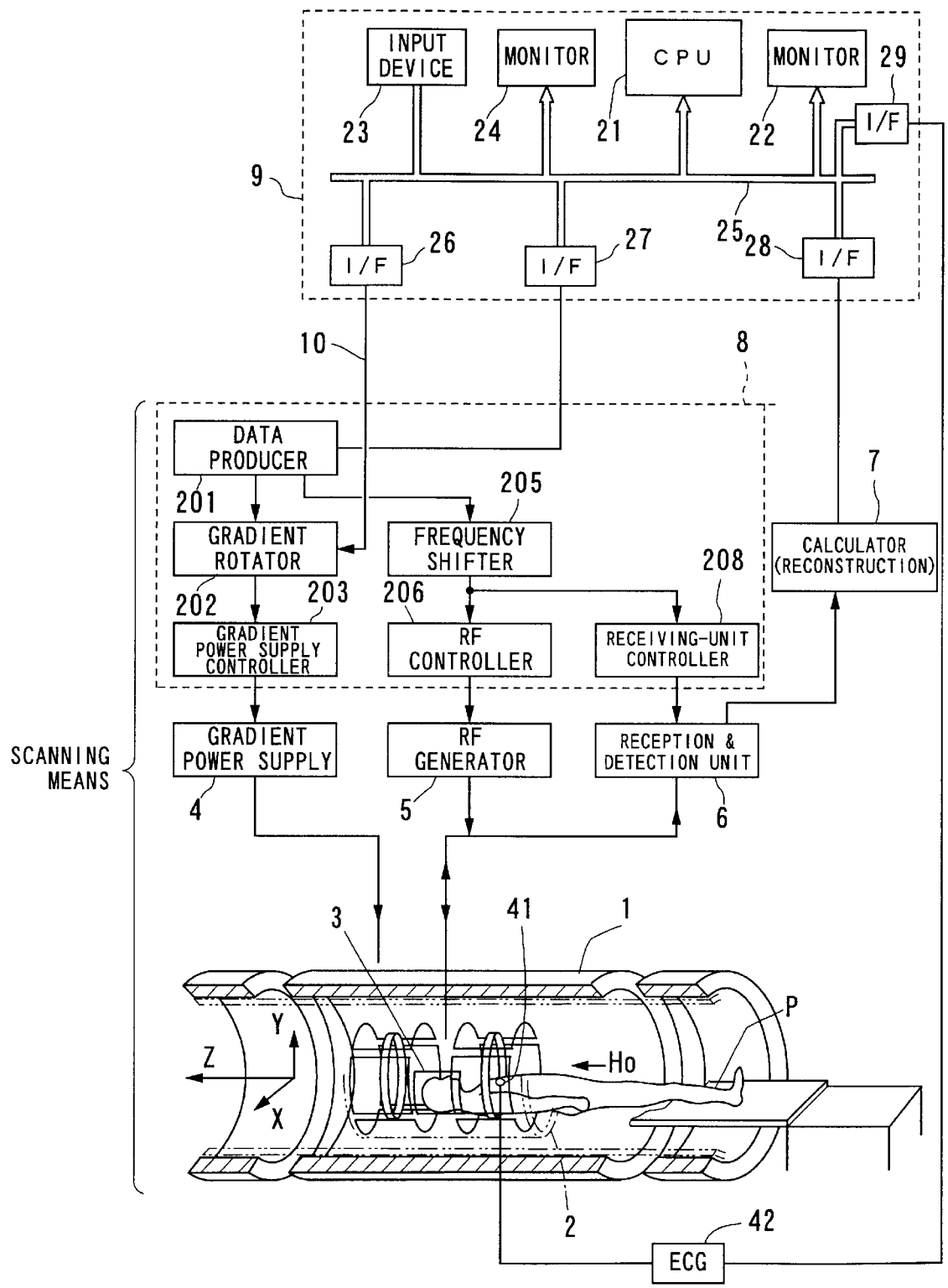
FIG. 1 is a schematic block diagram of an MRI system in which a three-dimensional locating and displaying system according to an example of the present invention is integrally practiced.

FIG. 1 outlines, together with an MRI system, the configuration of a three-dimensional locating and displaying system incorporated in the MRI system for practice.

The MRI system comprises an approximately cylindrical-like static magnetic field magnet 1 placed in a gantry, and a gradient coil 2 and an RF coil 3 both set around an object P to be examined inserted in the internal space of the magnet.

The MRI system further comprises not only a gradient power supply 4 connected to the gradient coil 2 but also an RF generator 5 and a reception and detection unit 6 both connected to the RF coil 3. The gradient power supply 4 provides a gradient coil (x-, y- and z-coils) with a series of pulsed currents formed based on pulse sequence information of gradients sent from a later-described sequence controller. The RF generator 5 generates RF pulsed currents in compliance with information about an RF-pulse sequence sent from a later-described sequence controller and supplies them to the RF coil 3.

Echo signals emanated in an object are detected by the RF coil 3, and routed to the reception and detection unit 6. This unit 6 performs given reception processing, including detection, with the received echo signals, with the result that the signals are converted to digital MR data sent to the calculator 7. The calculator 7, which constitutes part of the MRI system configuration, reconstructs the received MR data in the frequency space to produce actual-space image data.

Furthermore, the MRI system is provided with a sequence controller 8 that controls the foregoing gradient supply 4, RF generator 5, and reception and detection unit 6, and a graphical user interface (GUI) 9 (hereinafter, referred to as a user interface), connected to the sequence controller 8 and calculator 7 through a communication line 7, that carries out display, editing and analysis processing between the sequence controller and an operator (user) in an interactive mode.

The user interface 9 has a configuration where a CPU 21, memory 22, input device 23 and monitor 24 are connected to each other via a bus 25. The bus 25 is further connected to the sequence controller 8 and calculator 7 by way of the interface circuits 26 to 29 and the communication line 10.

The sequence controller 8 and the above user interface 9 compose an essential component of the three-dimensional locating and displaying system of the present invention.

The CPU 21 performs, between a user and the MRI system main frame, processing related to various types of display, editing, and analysis later-described. The memory 22 not only previously stores therein data of programs necessary for processing performed by the CPU 21 but also temporarily memorizes data required during the processing. The input device 23 is used by an operator to provide the system with desired commands, and includes a mouse and a keyboard.

Figure 2:
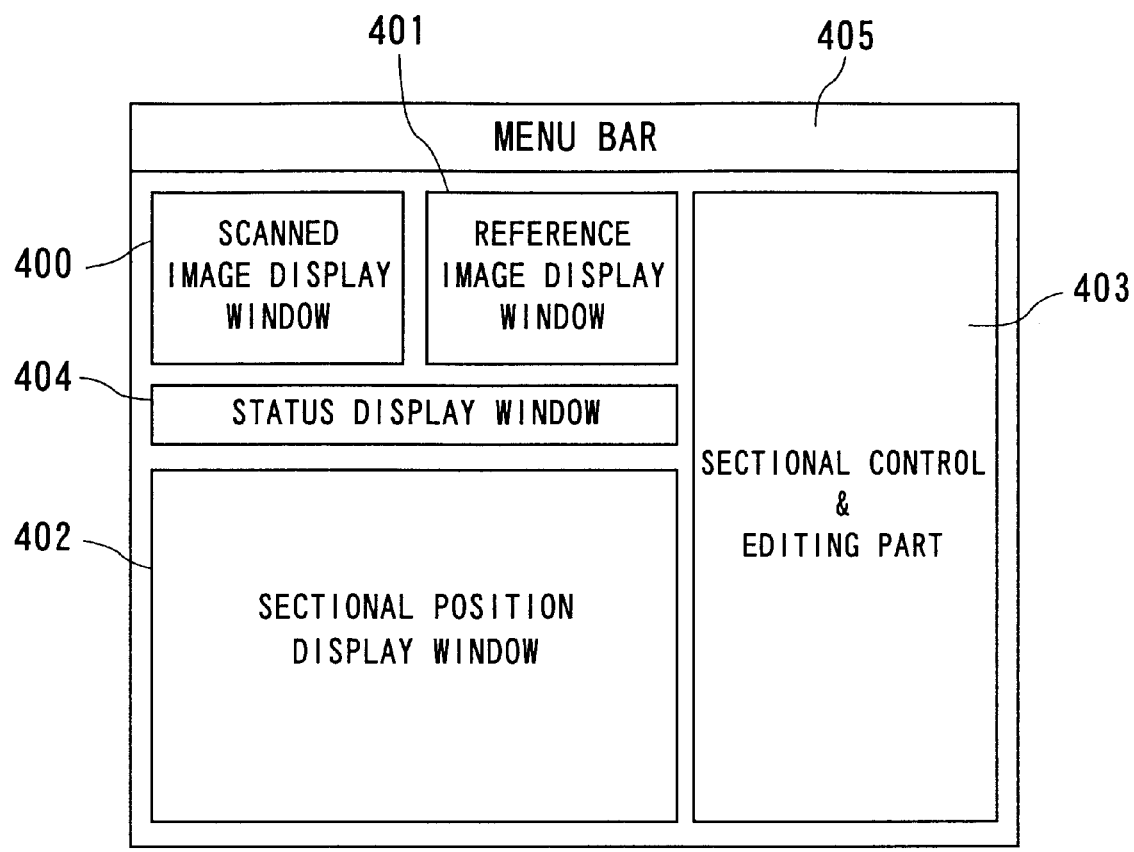
FIG. 2 shows a screen configuration of a graphical user interface of a first embodiment.

The monitor 24 dynamically displays a variety of images concerning setting a section and a variety of parameters and information about controlling the section. One example of such a display screen is shown in FIG. 2. As shown therein, the screen of the monitor 24 provides GUI functions, that is, provides a display function, an editing function, and an analysis function in graphics. Specifically, this screen includes a scanned image display window 400 displaying an image under the current acquisition, a reference image display window 401 displaying a reference image, a projected three-dimensional sectional position display window 402 (hereinafter referred to as a "sectional position display window") displaying a projected position of section specified in the three-dimensional absolute space, a sectional control and editing window 403 responsible for editing the rotation and shift of a section, and a state display window 404 displaying information about the section, and a menu bar 405 in which various types of functions are registered for using them. These windows 401 to 404 constitute a locating system (locator).

From a hardware viewpoint, the sequence controller 8 is provided with computer-related elements involving a CPU and memories. By its software processing, the sequence controller has functionally the data producer 201, gradient rotator 202, gradient power supply controller 203, frequency shifter 205, RF controller 206, and reception and detection unit 208 (refer to FIG. 1).

Using pieces of information representing the position and view point of and to a section to be scanned (scanned image) that has been specified by an operator, rotation, shift, and/or enlargement/reduction of the section are carried out through the above control system and its MR images are acquired. When the operator inputs via the input device 23 to a position and a view point of a section to be scanned, the CPU 21 calculates quantities of rotation, and enlargement and/or reduction and offset of the section, which correspond to those pieces of information, and sends the calculated quantities to the sequence controller 8. After this, the sequence controller 8 continues performing processing.

The sequence controller 8 receives information about both quantities of rotation and/or enlargement/reduction and a quantity of offset, which have been given from the user interface 9. In the sequence controller 8, those pieces of information are sent to the data producer 201, and are converted into a rotational matrix and a frequency shift quantity both of which are reflected by those pieces of information. In the production processing of the rotational matrix, to correct fluctuations in the enlargement/reduction and/or variances in intensities among channels, error correction is performed in which the matrix is multiplied by correction coefficients. The resultant rotational matrix is then sent to the gradient rotator 202, while the offset quantity is then sent to the frequency shifter 205.

The gradient rotator 202 converts information about the received rotational matrix to corresponding control information, then sends it to the gradient power supply controller 203. The frequency shifter 205 converts the received offset quantity to corresponding control information, then sends it to both the RF controller 206 and the receiving-unit controller 208. As a consequence, as the gradient power supply controller 203 controls the states of pulse generation in the gradient power supply 4 in accordance with both the received information and a previously specified pulse sequence of, for example, an FE-system continuous scan (fluoroscopy), the intensities of gradients to be superposed on a static field are dynamically changed in real time. Concurrently, because the RF controller 206 controls the conditions of the RF generator 5 with its RF pulse generation in accordance with both the received information and a previously specified pulse sequence of, for example, an FE-system continuous scan, the frequency of transmission RF pulses and their phases are dynamically changed in real time. Thus, in an asynchronous state where, as shown in U.S. Pat. No. 4,830,012, both changes in conditions of the pulse sequence and image reconstruction are separated in timing from data acquisition, the MR continuous scan (MR fluoroscopy) is performed, so that images of a region forming a specified section are continuously scanned, almost in real time. The receiving-unit controller 208 controls the frequency of an ADC detection used in the reception and detection unit 6 in response to the received control signal.

In this embodiment, scan means capable of executing the continuous scan are made up of the sequence controller 8, calculator 7, gradient power supply 4, RF generator 5, reception and detection unit 6, and gantry.

As to the pulse sequence for the continuous scan (fluoroscopy), a method of FE-system segmented EPI or multi-shot EPI on the type of FE may be used.

Thus, the gradient in each direction of the slice, phase-encode, and read-out, which are generated from the gradient coils 2, is changed in intensity and the transmission RF pulse outputted from the RF coil 3 is changed in both frequency and phase. Accordingly, a section to be scanned on the selected excitation basis is changed almost in real time to an operator-specified certain position. Magnetic resonance signals resulting from magnetic spins within the specified section are acquired as echo signals by the RF coil 3 and sent to the reception and detection unit 6. The echo signals are then subject to given types of reception processing in the reception and detection unit 6, sent in the form of echo data to the calculator 7 for reconstruction and other necessary processing.

Furthermore, there are provided an ECG sensor 41 attached to an object P to be scanned placed in the gantry and an ECG unit 42 for providing an ECG signal responsively to the input of the sensor signal from the ECG sensor 41. Such ECG detecting means, which are arranged as means for representing the object's cardiac cycle, may use other detecting means, such as PPG, for instance. This ECG signal is provided to the user interface 9, where it is read into the CPU 21 via the interface circuit 29. The CPU 21, if necessary, executes processing using the ECG signal.

Functions for various display, editing, and analysis performed by the user interface 9 in this embodiment will now be exemplified.

In this embodiment, the user interface functions are preferable when they are used as a locating system (locator) for a section scanned during the continuous scan (fluoroscopy). An operator can use their functions by selecting one or more functions in an adequate order. Thus, in imaging of, by way of example, the heart region that moves fast, a desired region of interest can be found in a shorter time, and a section or volume region can be set at the found position in a steady manner.

Figure 4:
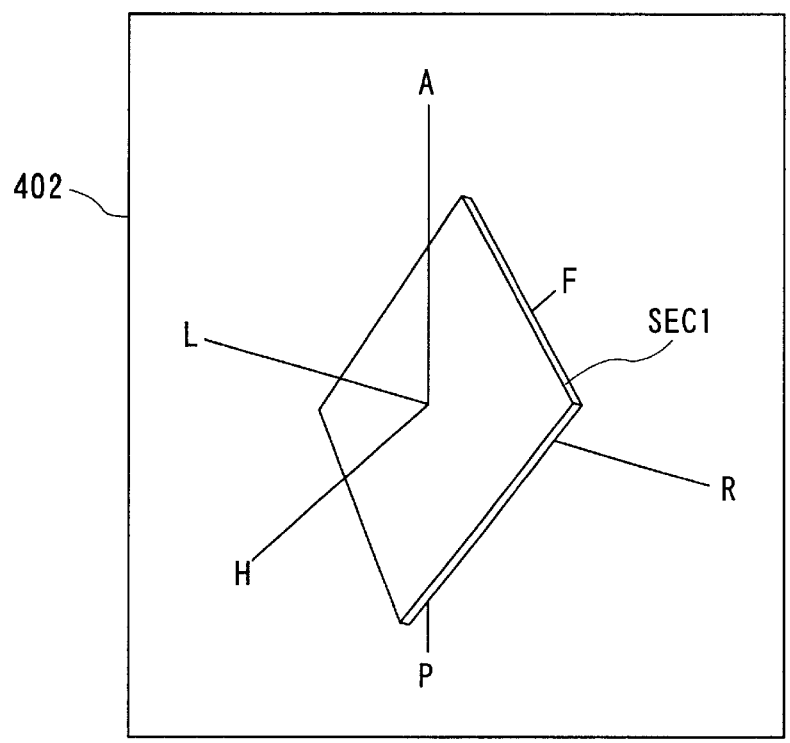
FIG. 4 exemplifies one function of the graphical user interface.
Figure 5:
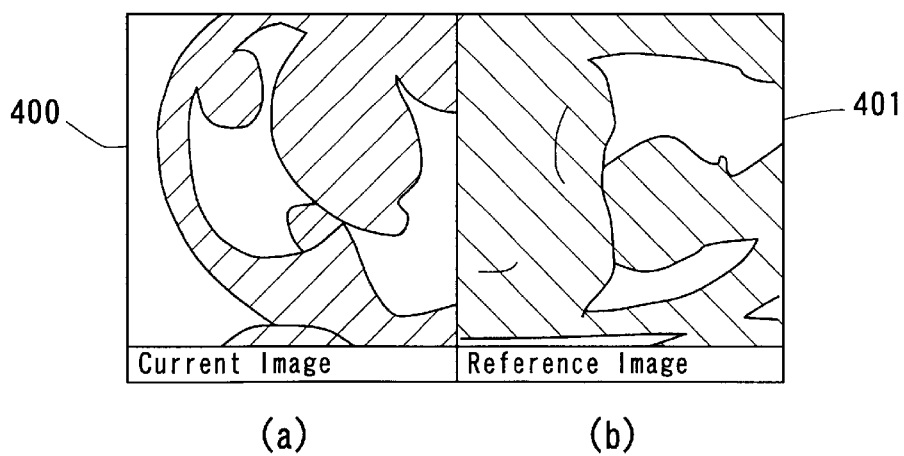
FIG. 5 exemplifies another function of the graphical user interface.

These functions are shown as the following items a to s. Every time when any item is specified by an operator via the input device 23, the CPU 21 performs the processing corresponding to the item so as to provide it on the screen of the monitor 24 (refer to FIG. 3).

a. Display of coordinate axes and three-dimensional display of specified section:

When this function is activated, the three-dimensional physical (absolute) coordinate axes in the static magnetic field generated by the magnet 1 are displayed at the sectional position display window 402, then a section is positionally specified and 3D-displayed as a section SEC1 in the absolute three-dimensional coordinate space, as shown in FIG. 4. This display provides an operator with a relationship between a patient placed in the bore of the magnet 1 and a section to be scanned thereof, which causes the operator to easily understand the relationship. The positional information of the specified section is sent to the scan means, where the specified region is scanned in almost real time.

b. Display of both newest scanned image and reference image:

In response to the activation of this function, an image currently scanned is displayed at the scanned image display window 400. Every time when new image data at a specified section region are reconstructed by the calculator 7, the image data are received to be displayed at the window 400 as illustrated in FIG. 5(*a*). Because the continuous scanning is performed, the images represented at the window 400 are updated in almost real time.

Figure 6:
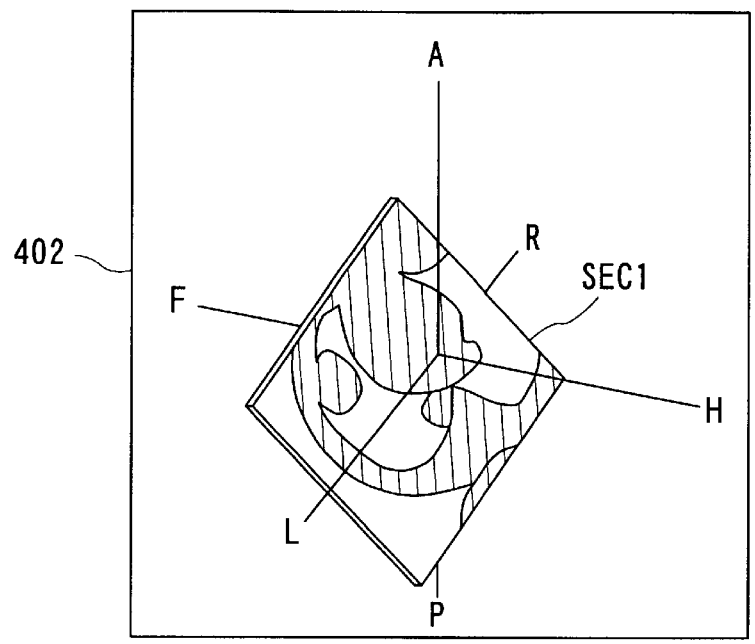
FIG. 6 exemplifies still another function of the graphical user interface.
Figure 7:
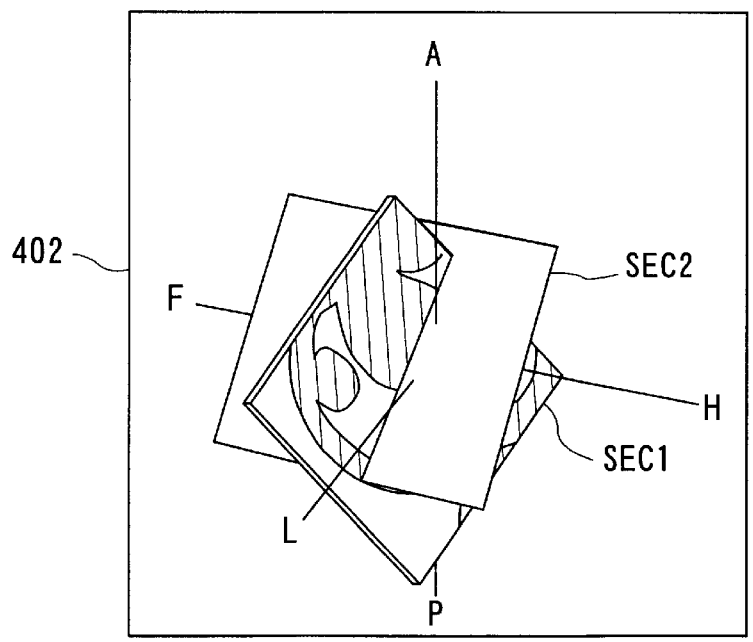
FIG. 7 exemplifies still another function of the graphical user interface.
Figure 8:
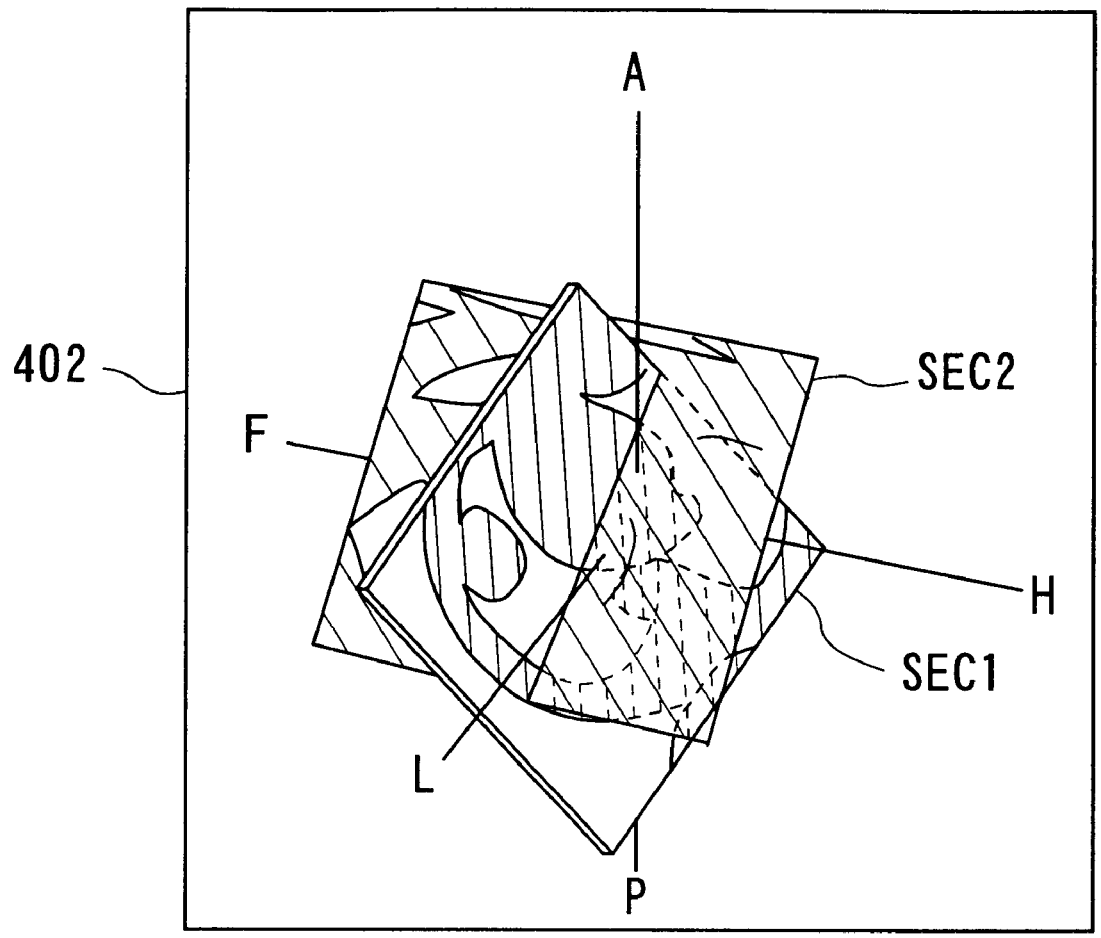
FIG. 8 exemplifies still another function of the graphical user interface.
Figure 9:
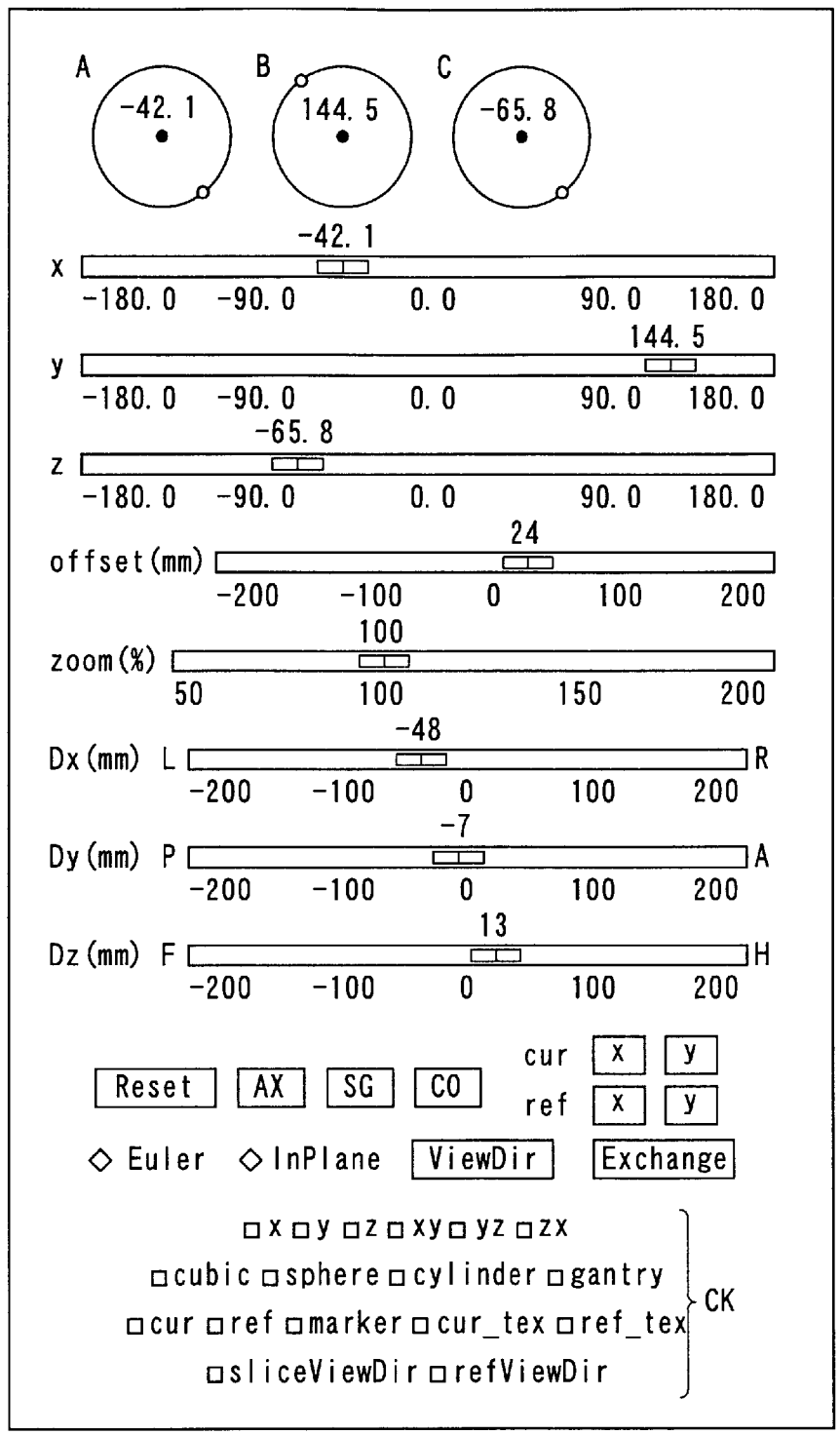
FIG. 9 exemplifies still another function of the graphical user interface.

At the reference image display window 401, an image selected as a reference image is displayed as shown in FIG. 5(*b*). The reference image will be kept on displaying, as it is, until the next selection of the reference image.

c. Pasting newest image on specified section (translucency processing):

The activation of this function allows a currently scanned image to be pasted on the section SEC1 displayed at the sectional position display window 402, as shown in FIG. 6. This pasting helps an operator grasp a three-dimensional sectional position. It is preferred that the pasted image is formed into a translucent image of which transparency is changeable by translucent processing. This processing prevents objects existing behind this image from being hidden.

d. Display of reference section:

The start of this function permits the other section (reference section) SEC 2 providing a reference image to be displayed at the sectional position display window 402, as shown in FIG. 7. This display facilitates understanding the positional relationship of the currently scanned specified section SEC1 in the object's three-dimensional space. A click of a predetermined button in the menu bar 405 causes the CPU 21 to switch the current specified section (position) SEC1 to the reference section (position) SEC2 or to exchange their sections to each other. This provides an easy operation.

e. Pasting reference image on reference section (translucency processing):

When this function starts, the reference image is pasted on the reference section SEC2. Thus the two section images of both the reference section SEC2 and the currently scanned section SEC1 are three-dimensionally displayed in the sectional position display window 402, as illustrated in FIG. 8. Thanks to the images of these two sections, the three-dimensional position can be understood easily. Preferably, either image that positions at the front to the viewer, for example, the reference image, is translucency-processed prior to the display. This makes it possible to observe in a transparency mode a scanned section image or a three-dimensional model (when produced and displayed as later described) placed behind the frontal image.

f. Sectional control (positional changes of sections and changes of display attributes):

As exemplified in FIG. 9, there are provided slide bars and buttons in the sectional control and editing window 403. Operating these provided members by an operator makes it possible to send information about its operation to the CPU 21 in which necessary processing is performed. That is, the sectional control and editing window 403 functionally provides means for commanding positional changes of scanned sections and means for commanding changes of attributes of displayed images.

In this embodiment, there are slide bars x, y and z controlling three-axis rotation of a scanned section, a slide bar "offset" controlling the center of sectional rotation, a slide bar "zoom" controlling enlargement/reduction, and check buttons ck controlling both a three-dimensional model showing a reference model and the display/non-display of the coordinate axes and coordinate sections.

Figure 10:
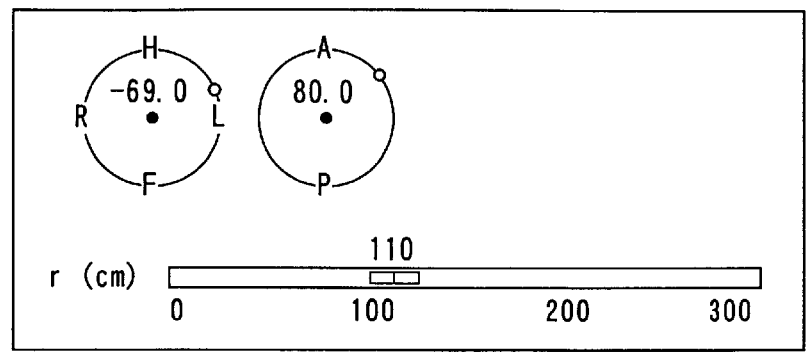
FIG. 10 exemplifies still another function of the graphical user interface.
Figure 11:
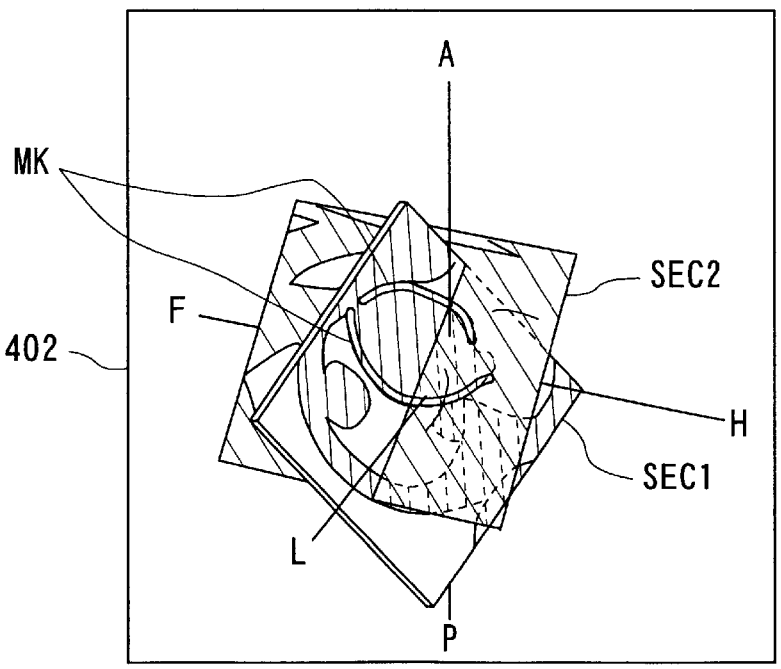
FIG. 11 exemplifies still another function of the graphical user interface.
Figure 13:
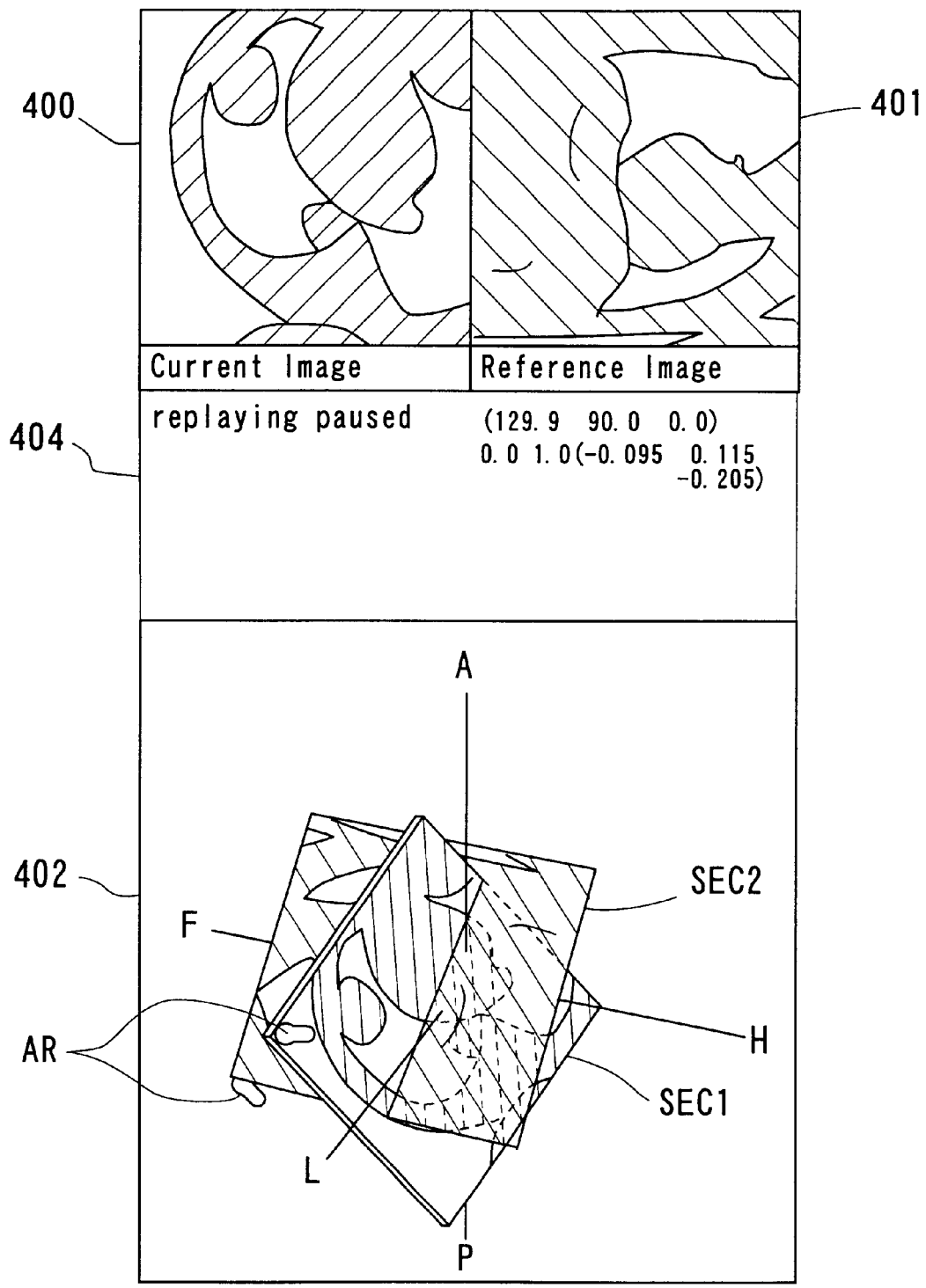
FIG. 13 exemplifies still another function of the graphical user interface.

A further feature of this sectional control concerns a way of commanding the three-axis rotational control for the foregoing specified section (section to be scanned). Although the foregoing slide bars x, y and z are provided as to the three-axis rotational control, three circular bars A, B and C, which are kinds of circular buttons, are additionally provided at the immediately upper positions to the slide bars x, y and z, as shown in FIG. 9. Each of the circular bars A, B and C is assigned to each of three parameters for the three-axis rotation and provides a rotational parameter which returns to the original position after one turn. A currently set value of the parameter is displayed in real time within the circular portion of each of the circular bars A, B and C. In the case that the parameter value is changed, a mouse pointer is placed on each circular bar, and the left mouse button is clicked, for instance. An angle made between a radial segment passing both the clicked position and the circular center and a predetermined reference line produces a parameter value. This value is also displayed in real time in the form of numerals. Another way of setting parameters is that, with the mouse button held, the mouse pointer placed within any circular bar is rotated around its center, which causes the parameter to be changed continuously. Using the circular bars in this way in controlling the three rotational angles for a section to be scanned leads to an easier operation. The circular bars are preferably applied to control of the view points to which the following item g is related.

g. Sectional control (positional changes of view points):

As shown in FIG. 10, the sectional control and editing window 403 provides means that easily change the positions of view points for observing the foregoing absolute coordinate axes. This changing means makes it possible that a view line along which an operator looks at a specified section (section to be scanned) moves freely, providing a virtual condition where the operator can confirm a sectional position as if he would walk around an object. This changing means is composed of the circular bars operating the rotational coordinate system ($\phi$, $\theta$, r), slide bars, and CPU. On account of the circular bars, the two parameters made up of angular components of a view point can be changed easily.

h. Specification of position in image:

There is provided a function that causes such an input device as a mouse pointer to specify a position in the image produced by the above changing means. This function allows a spatial position corresponding to the specified position to be displayed in the sectional position display window 402 as a point or segment MK, differently in hue from the image (refer to FIG. 11). The display member formed by the point or segment MK is fixedly displayed in the space even though the sectional position would be changed. Moreover the member can be displayed by a plurality of pieces. Thus the display member can be utilized as a marker. The marker is preserved in the condition under which the marker can be edited (deleted, attribute-changed) the marker, and can be read at any time. Additionally there is provided a function that moves a specified section to the position of the marker. In particular, for a linear marker, the movement is performed with an axis within the section in accord with the marker.

i. Providing reference position to specified section:

By this function, an actual rendering three-dimensional image on a three-dimensional or scanned image of an object is displayed at the sectional position display window 402 in a superposition fashion, providing an operator with a reference position for a specified section (section to be scanned). Also, the direct use of an image scanned with a sectional position shifted makes it possible to compose a rendering three-dimensional image. As concerning this, an additional function is provided, which mutually connects the positions of markers that an operator has set on the above section so that an object is rendered with polygons.

j. Storage of position of displayed section and return to stored position:

With use of this function, means for not only recording sectional positions which were displayed at any time (refer to FIG. 12) but also returning to the recorded position are provided The CPU 21 and memory 22 form this means. By this recording, provided are icons representing a scanned image at a recorded sectional position and a size-reduced image of the sectional position display window 402.

k. Description of absolute position of specified section:

The absolute position of a specified section (section to be scanned) is described with less parameters, such as an enlargement coefficients, move vectors, and Euler's angles. This reduces an amount of data that should be processed.

l. Specification of section to be scanned:

As means with which an operator specifies a section to be scanned at a desired position, this function provides means for specifying a sectional position with Euler's angles and means for specifying a rotational position both around two rotational axes on a section and a perpendicular axis to the section. Although the later specifying means depend on the order of rotation, the former one is independent of the order of rotation. Those rotatable sections can be mutually displayed in sequence.

m. Display of arrow of view line:

Making use of this function permits an arrow AR to be displayed in the sectional position display window 402, the arrow representing that an image in the scanned section display window 400 is viewed along which direction (refer to FIG. 13). When the image is reversed, means to view the image along the opposite direction are provided, where the arrow AR is changed to move to the opposite side of the section in the image. The display position of the arrow within the window 402 is assigned to, for example, an upper left position, in an automatic fashion, quickly providing an operator with the relationship between the image and the section.

Figure 14:
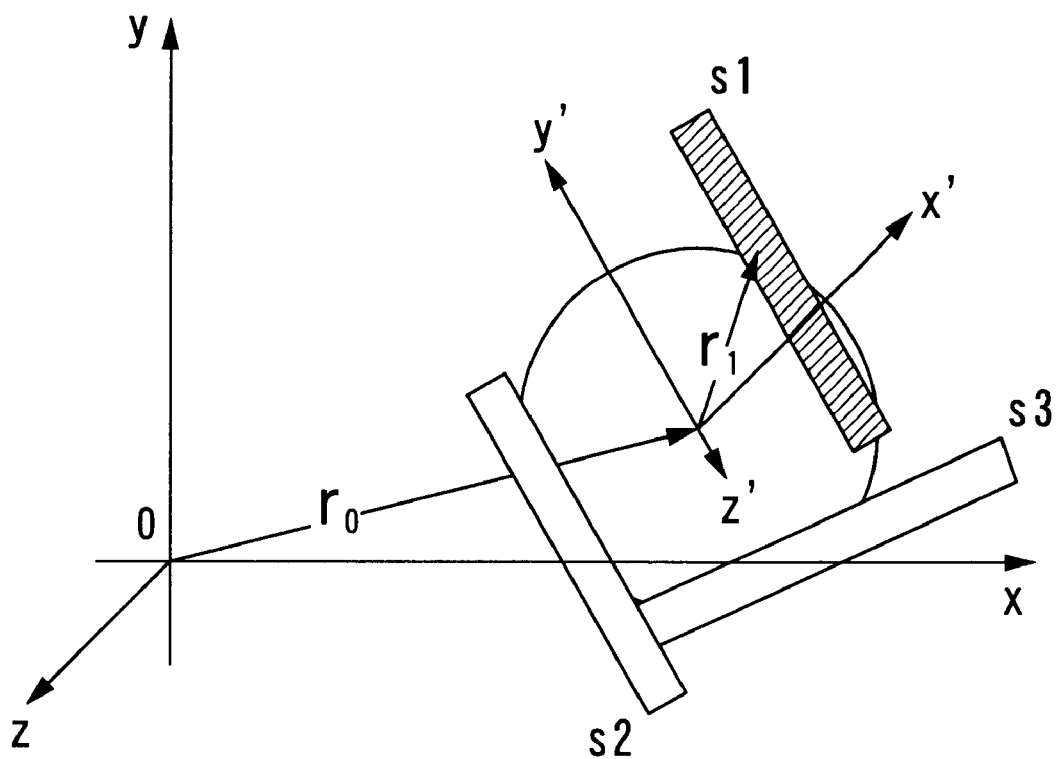
FIG. 14 illustrates one positionally specifying technique for a section in the three-dimensional space.

There can also be provided means for displaying a similar arrow in the reference image display window 401, independently of the window 402. In such a case, it is preferable that display colors of the two arrows are differentiated from each other between the windows 401 and 402 for an easier recognition.

n. Display/non-display of projected 3D display:

Using this function, it is easy to control, from the sectional control and editing window 403, the display or non-display state of an image in the sectional position display window 402. This prevents the superposition of images in the window 402.

o. Dynamic planning (macro function):

This function enables a series of dynamic planning processes. This planning is realized with a macro function that describes an amount of movement and a rotational angle as functions of time. This makes it possible that images undergoing stylized sectional shift or omnibearing rotations at a certain position are obtained through easy operations. It is also possible for an operator to describe and register desired procedures.

p. Continuous scanning using parameters:

As shown in FIG. 14, this function enables continuous scanning of a cylindrical object with reduced-number parameters including three degrees of freedom of translation and three degrees of freedom of rotation, and further three degrees of freedom of translation. These parameters may be changed continuously with the foregoing macro function. For example, as shown in FIG. 14, a fixed coordinate system x-y-z is translated by an amount of a vector r0, rotated on a coordinate system x'-y'-z', and rotated again by an amount of a vector r1. Continuously changing the rotational angle causes the section to continuously change as shown by s0, si, s2 and so on. This manner is especially proper for continuous scanning of the heart wall and others. Additionally, if there is a construction that the vector r1 is automatically extracted from images of orthogonal sections under processing, the sections are made to automatically trace the scanning around the heart wall, during which an image of each section is scanned.

q. Continuous recording of sectional positions and replay:

This provides a function of continuous recording of sectional positions and replay thereof. This function also includes another function capable of causing the replay to be stopped during its operation and changing the sectional position from its stopped position for recording. Like the normal operation, the replay of this recorded information operates to output to the control system the positional information about recorded sections such that image acquisition is automatically performed in almost real time.

r. Functions of enlargement and reduction:

These enlargement and reduction functions are able to change intensities of gradients and states of RF signals at any time, resulting in that the size of a ROI is enlarged or reduced to its desired one.

s. Automatic mean operation:

This function operates when a small same region in the three-dimensional space is traced a plurality of times. Mean processing is automatically performed with the acquired images, improving image quality.

A variety of interface functions on the above items a to s are selected according to necessity and used in a proper order. For example, in imaging of the heart whose movement is fast, an operator, while observing the screen, can find a desired region of interest in a shorter time, then steadily place a section or volume region at the found position.

The foregoing embodiment has been described about an MRI system performing continuous scanning, but the embodiment may be applied to an input apparatus for specifying sectional positions necessary for MPR (section conversion) in an MRI system.

Figure 15:
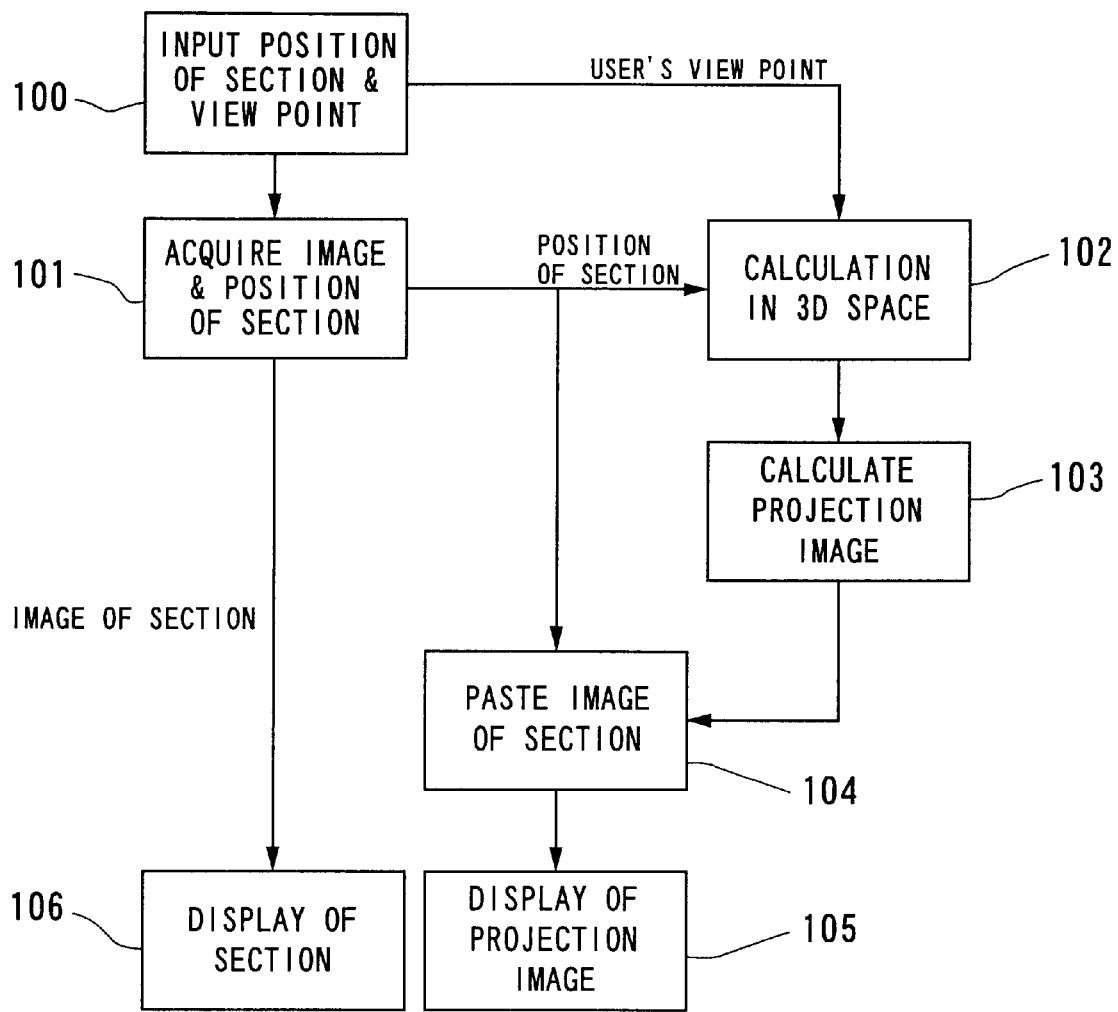
FIG. 15 is the outlined flowchart of processing showing an example that employs MRI processing.

For instance, as shown in FIG. 15, in response to an operator's input of desired positions of a section and a view point (step 100), those pieces of information are sent to a modality (image acquiring system), and information about an image and a position of a section corresponding to them (step 101). The sectional position and view point information are converted into positions in the three-dimensional space (step S102), and using three-dimensional image data previously acquired, a three-dimensional projected image is calculated with MPR (step 103). This three-dimensional projected image is pasted on the section at the specified position seen from the view point (step 104), then displayed as a three-dimensional projection (step 105). Concurrently, a scanned two-dimensional image is also displayed (step 106). Thus two types of images, namely, a two-dimensional image and a three-dimensional projected image at a specified sectional position, are displayed. Observing these images facilitates a spatial understanding of a section to be scanned, providing an easy and more accurate sectional positioning manner.

The three-dimensional image data for MPR may be stored in either the MRI system or the interface. In addition, data acquired by another type of modality, such as a three-dimensional ultrasound diagnostic apparatus, may be used as such three-dimensional image data.

Further the present invention is not confined to the foregoing embodiment and its modifications. It is possible that a person having ordinary skill in the art performs further appropriate combinations, changes, or alterations within the scope of the principles of the present invention. Those can be included into the present invention described in the claims. For example, as expressed by the items, the functions realized by only items of a to c, e to h, m, and o to q can be combined into another operation.

Figure 16:
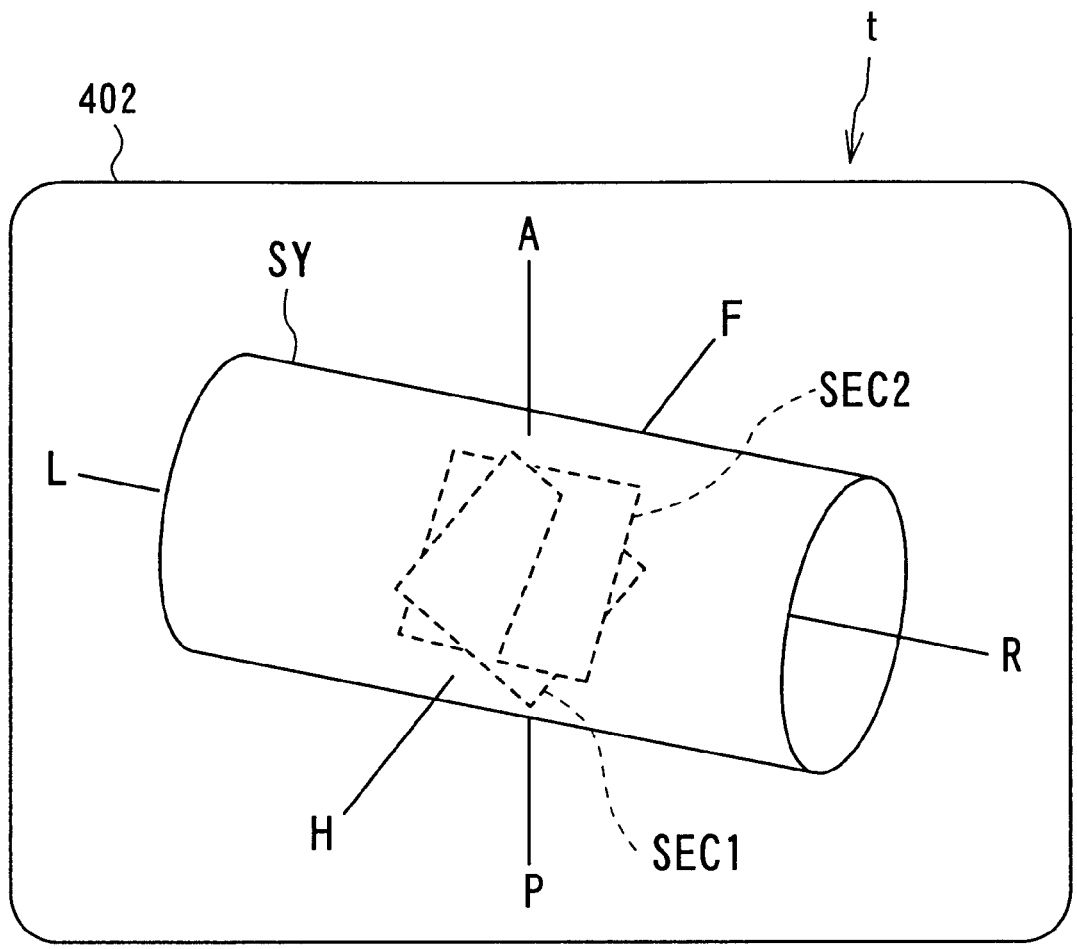
FIG. 16 explains another function of the graphical user interface.

In addition, FIG. 16 shows another function t which can be added to the foregoing items a to S. When this function t is started in displaying a specified section SEC1 and a reference section SEC2 based on the crossed two-section method, a three-dimensional member SY formed into a substantially cylindrical shape is displayed to pictorially show the static magnetic field space within the gantry. At the center of the inner magnetic field, both the specified section SEC1 and the reference section SEC2, which are crossed to each other, are located and displayed three-dimensionally. The three-dimensional member SY and the two sections SEC1 and SEC2 are projection-displayed, for example, in differentiated hues from each other. This image is displayed at the sectional position display window 402. This helps understand more easily a positional relation between the crossed two sections SEC1 and SEC2 in the static magnetic field.

(Second Embodiment)

Referring to FIGS. 17 to 20, a second embodiment of the present invention will now be described.

For one use of the three-dimensional locating and displaying system according to the foregoing embodiment, there is a situation where a three-dimensional rendering image for an object to be scanned is placed at the coordinate center and locating in the inner space thereof is performed. However, a problem is raised for this locating; that is, it takes a longer time to acquire three-dimensional image data of the object. Hence, the present embodiment is provided to improve such a situation.

A three-dimensional locating and displaying system according to the second embodiment is integrally incorporated into an MRI system, like the foregoing embodiment, and has a function of being able to perform the location of a three-dimensional image in the coordinate center of the static magnetic field. This function is achieved by software processing executed by the CPU 21, which is outlined in FIG. 17.

Figure 17:
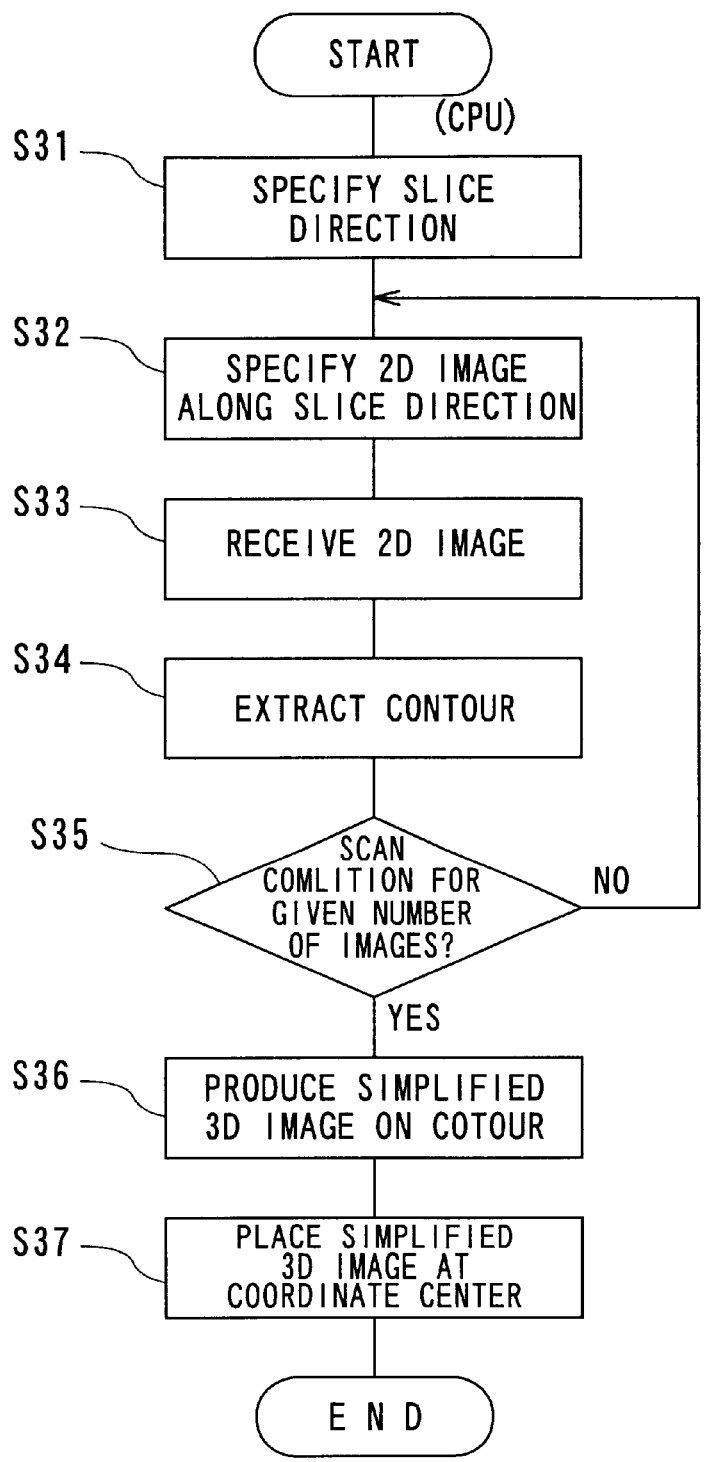
FIG. 17 outlines a flowchart showing processing of a CPU performed in a second embodiment.
Figure 18:
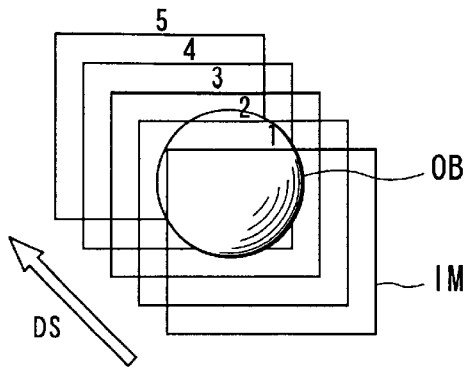
FIG. 18 is an illustration of two-dimensional scanning performed a plurality of times along a specified slice direction, which explains the production of a simplified 3D image.
Figure 19:
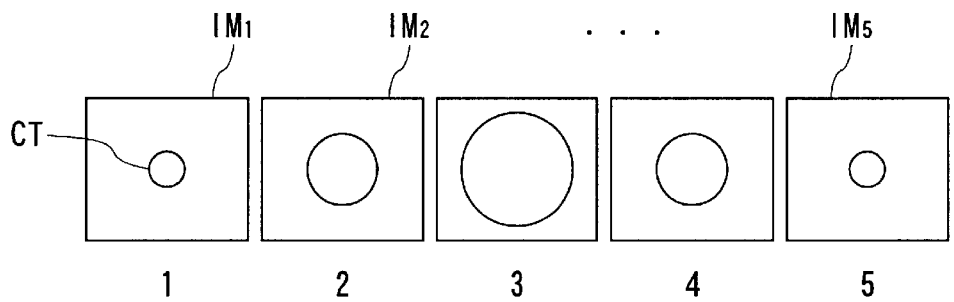
FIG. 19 is the illustration of two-dimensional images obtained by a plurality of times of two-dimensional scans along a specified slice direction.
Figure 20:
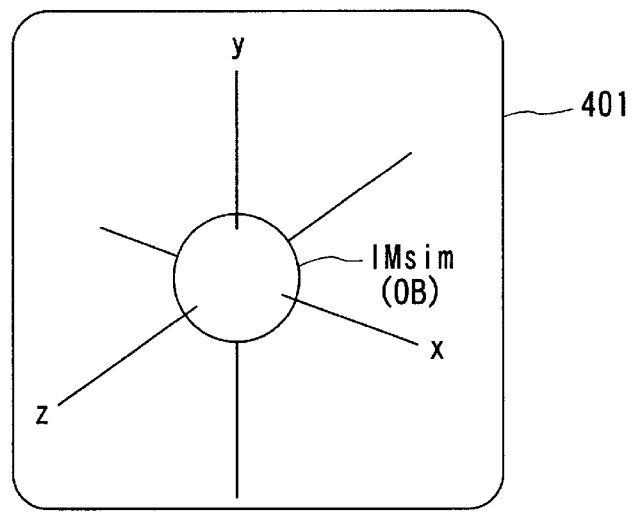
FIG. 20 explains a state in which a simplified 3D image is displayed as a reference image.

As shown in FIG. 17, the CPU 21 specifies a slice direction DS for an object OB to be scanned on the basis of operational information given by the input device 23 or information automatically set, for example (step S31: refer to FIG. 18). The CPU 21 then commands the scanning means to perform two-dimensional scanning (or continuous scanning) along the slice direction DS, and receives a resultant two-dimensional image IM (step S32 and S33). Then a contour CT of the object OB is extracted from the two-dimensional image IM (step S34: refer to FIG. 19). This series of processing steps is carried out for a predetermined number of two-dimensional images IM (for example, $IM_1$ to $IM_5$: refer to FIG. 19) (step S35). Then the CPU 21 produces a simplified three-dimensional image $IM_{sim}$ using the individual data of the contours CT of the two-dimensional images IM (step S36). The data processing time for this production is kept in a relatively short range, because MIP processing or volume rendering processing is used. The simplified three-dimensional image $IM_{sim}$ of the object OB, thus-obtained, is placed at the coordinate center as a reference image (step S37).

Based on the relationship between the reference image on this simplified three-dimensional image IMsim and the position of a specified section to be located, the position of the specified section is spatially grasped. Thus a specified section is located at a desired position, and an image of the section can be observed in real time, like the foregoing embodiment.

Because the simplified three-dimensional image $IM_{sim}$ is obtained from two-dimensional images continuously scanned while slicing along a given direction, a three-dimensional reference image of an object OB can be obtained in a shorter time, compared to the true three-dimensional scanning of the object OB. Since this three-dimensional reference image is used only for the purpose of locating, such simplified image is still effective. Thus the location making use of both the three-dimensional reference image $IM_{sim}$ and a specified section permits the position of the specified section to be grasped by intuition, resulting in a speedy and accurate imaging.

(Third Embodiment)

Figure 21:
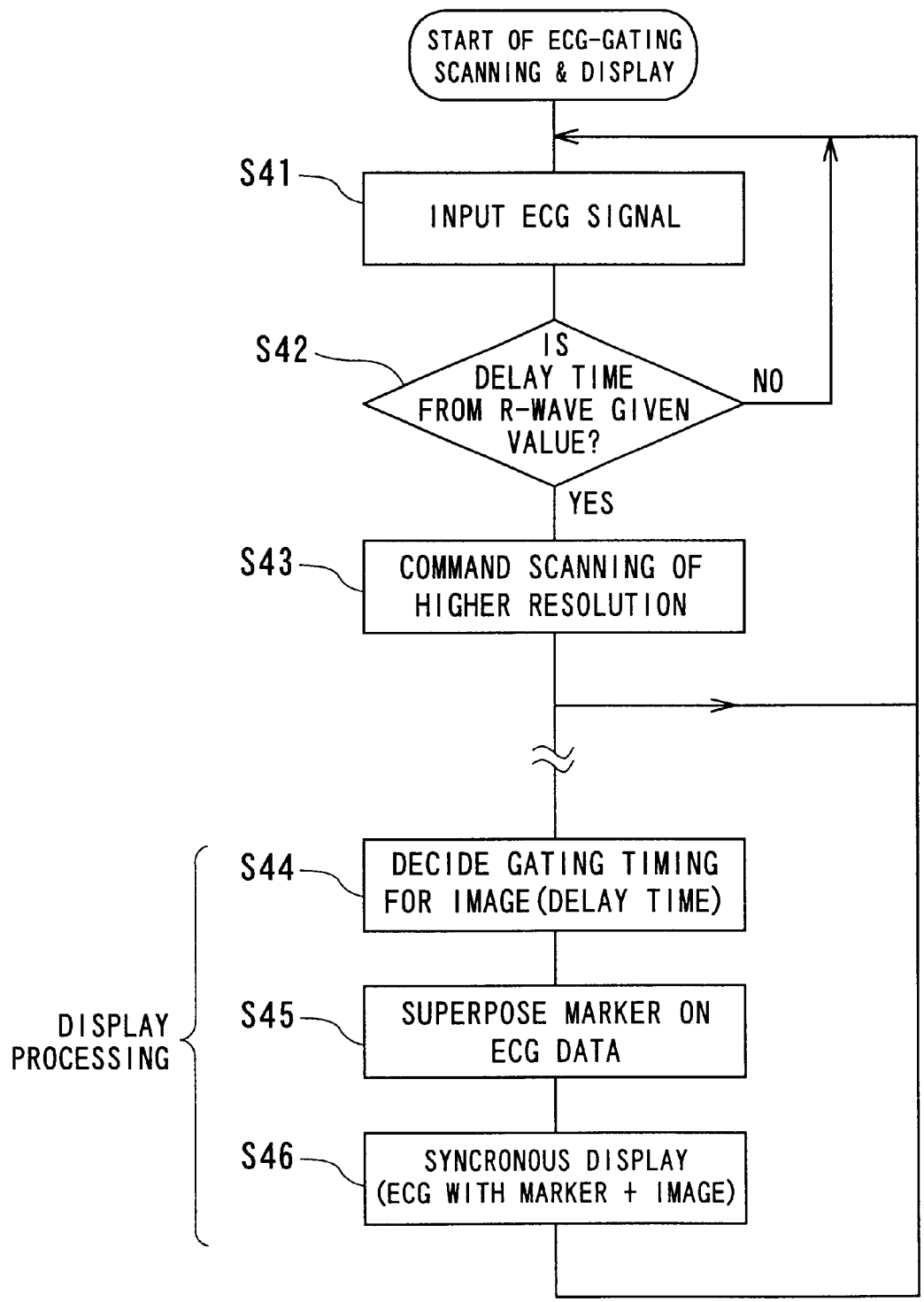
FIG. 21 is an outlined flowchart showing the processing of an CPU that is practiced in a third embodiment.
Figure 22:
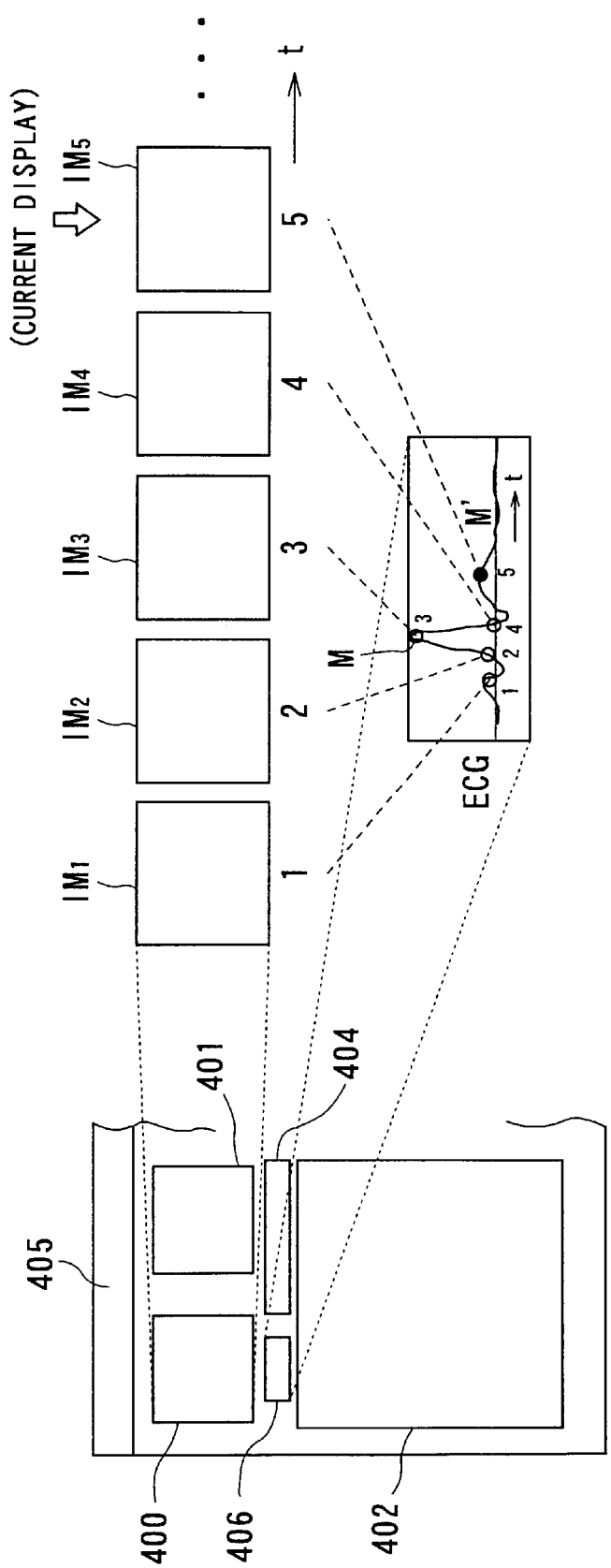
FIG. 22 explains synchronous display between ECG waveforms with markers and MR images.

Referring to FIGS. 21 to 22, a three-dimensional locating and displaying system according to a third embodiment will now be explained. The present embodiment concerns a display technique of images acquired by electrocardiographic-gating mode scanning.

As described above, an MRI system in which the three-dimensional locating and displaying system of the first embodiment is incorporated is well used in observing a region of interest as grasping in real time a three-dimensional position within an object. Where this is applied to organs such as the heart, which move periodically, locating and observation should be performed at a higher frame rate ranging from a few frames per second to scores of frames per second. However, employing such a technique unwillingly sacrifices spatial resolution. Therefore, when the location is finished, the scanning is switched to another one of higher spatial resolution performed on the electrocardiographic gating. However, in displaying scanned images, mere switching makes it confused that each image corresponds to which temporal phase of the electrocardiographic waveform, bringing about obstacles to observation and diagnosis. The present embodiment is to improve such a situation.

Specifically, the CPU 21 executes processing outlined in FIG. 21. After locating, when images of higher resolution are required, the CPU 21 receives an ECG signal, and determines whether or not a delay time from an R-wave of the signal reaches a predetermined value which will be updated by a given interval (for example, 100 msec) (steps S41 and S42). If this determination is YES, it is recognized that the delay time from the R-wave is coincident with an ECG-gating time that will be shifted by, for example, 100 msec. Thus the CPU 21 instructs the scanning means to perform scanning of a higher resolution than that performed so far (step S43).

In parallel with this scanning of a higher resolution, the CPU 21 commands display processing (steps S44 to S46). Specifically, the CPU accepts a two-dimensional image IM sent from the calculator 7, then decides gating timing (delay time) to the two-dimensional image IM (step S44). Further the CPU causes data of a marker M to be superposed at a position on the ECG waveform data, corresponding to the above gating timing (step S45). Further the CPU 21 displays on the monitor 24 both the ECG waveform on which the marker M is superposed and the two-dimensional image IM in synchronized timing (step S46).

As shown in FIG. 22, at the scanned image display window 400 formed on the screen of the monitor 24, the two-dimensional image IM ($IM_1$ to $IM_5$) scanned at a higher resolution is displayed as being updated with time t elapsing. In parallel with this, a physiological information display window 406 formed on the screen, the ECG waveform is displayed with time t elapsing. The marker M is also superposed on this ECG waveform every gating time. Thus in synchronization with the image IM updated, the ECG waveform and the marker M thereon are updated. A marker M corresponding to scanning time of a two-dimensional image IM currently under display is represented, differently from those that have appeared already, for example, brightness levels (or hues). For instance, in the example shown in FIG. 22, the scanning time of a two-dimensional image IM5 now under display is represented by a marker M' on the ECG waveform.

Although in the above embodiment, the ECG waveform is displayed synchronously with the image data acquisition in scanning, the ECG waveform may be displayed synchronously with images replayed after scanning.

Therefore, even when the electrocardiographic gating is used, it becomes quite clear that images displayed (or replayed) correspond to which temporal phases on the electrocardiographic waveform.

Alternatively, the ECG waveform with the markers may be superposedly displayed in the scanned image display window 400.

This embodiment has employed the construction that the ECG signal is detected with scanning and both the signal and image are displayed synchronously, but the signal can be replaced by waveforms of physiological information, such as a waveform on the electroencephalogram gating PPG (peripheral gating), a waveform on the respiratory gating.

Further, the above MRI system can be applied to functional MRI (fMRI). In fMRI, stimulus (input stimulus) including light, sound, air, or electricity are given to an object and images and/or data are acquired, in which responses to the stimulus are reflected. Thus the waveforms of such input stimulus are displayed in the physiological information display window 406, while images or data curves are synchronously displayed, as being outputs against the stimulus, in the scanned image display window 400.

Further this technique can be applied to temperature measurement. As an example, in cases where heating energy from laser therapy is applied to an object to obtain a temperature curve within a region of interest in a real-time image continuously scanned, a rectangular waveform representing the on and off states of the laser output is displayed in the physiological information display window 406, while a temperature curve changing in accordance with the waveform is displayed in the scanned image display window 400.

(Fourth Embodiment)

Figure 23:
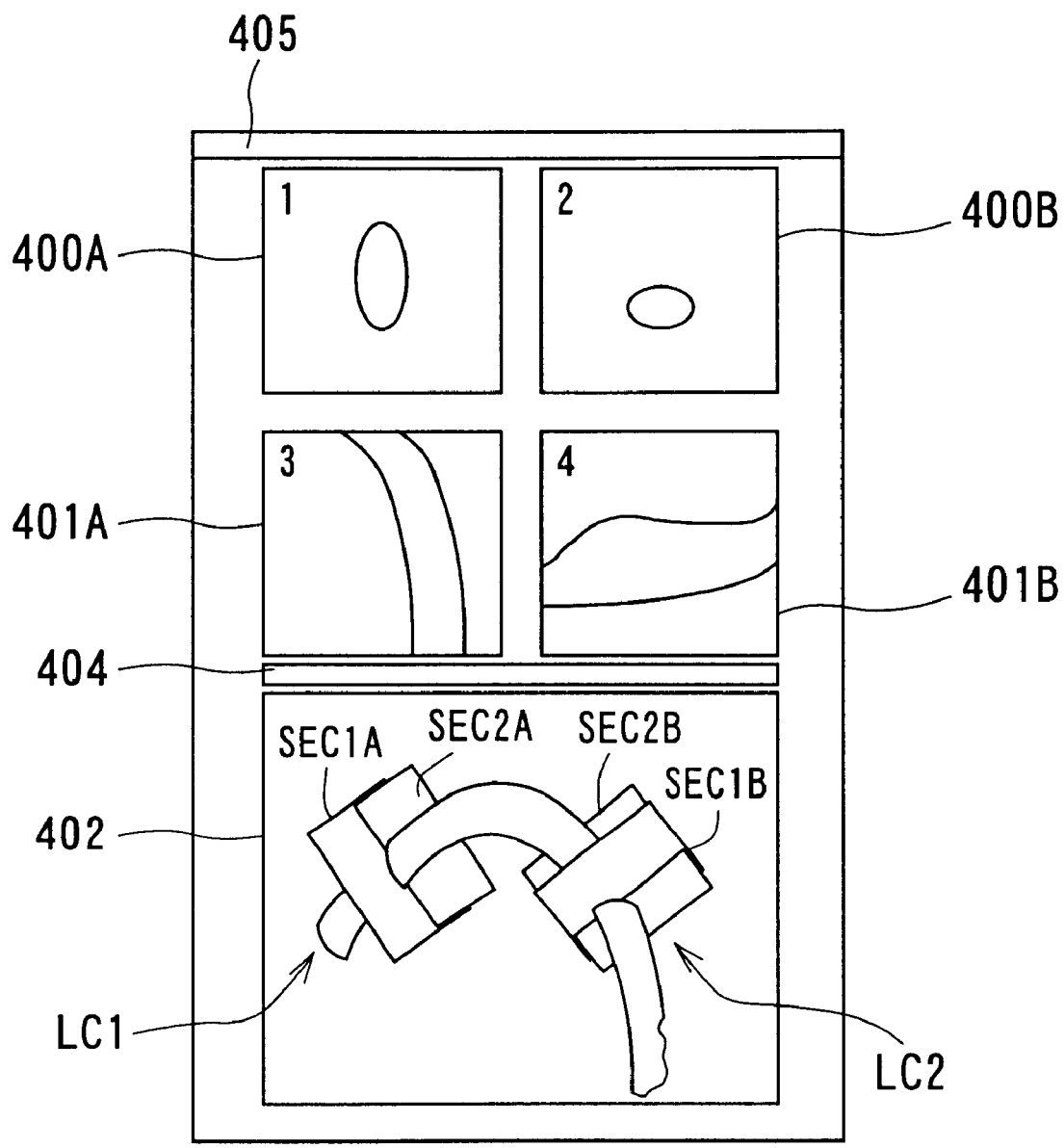
FIG. 23 is an illustration for two locating systems (locators) realized by software processing in a fourth embodiment.
Figure 24:
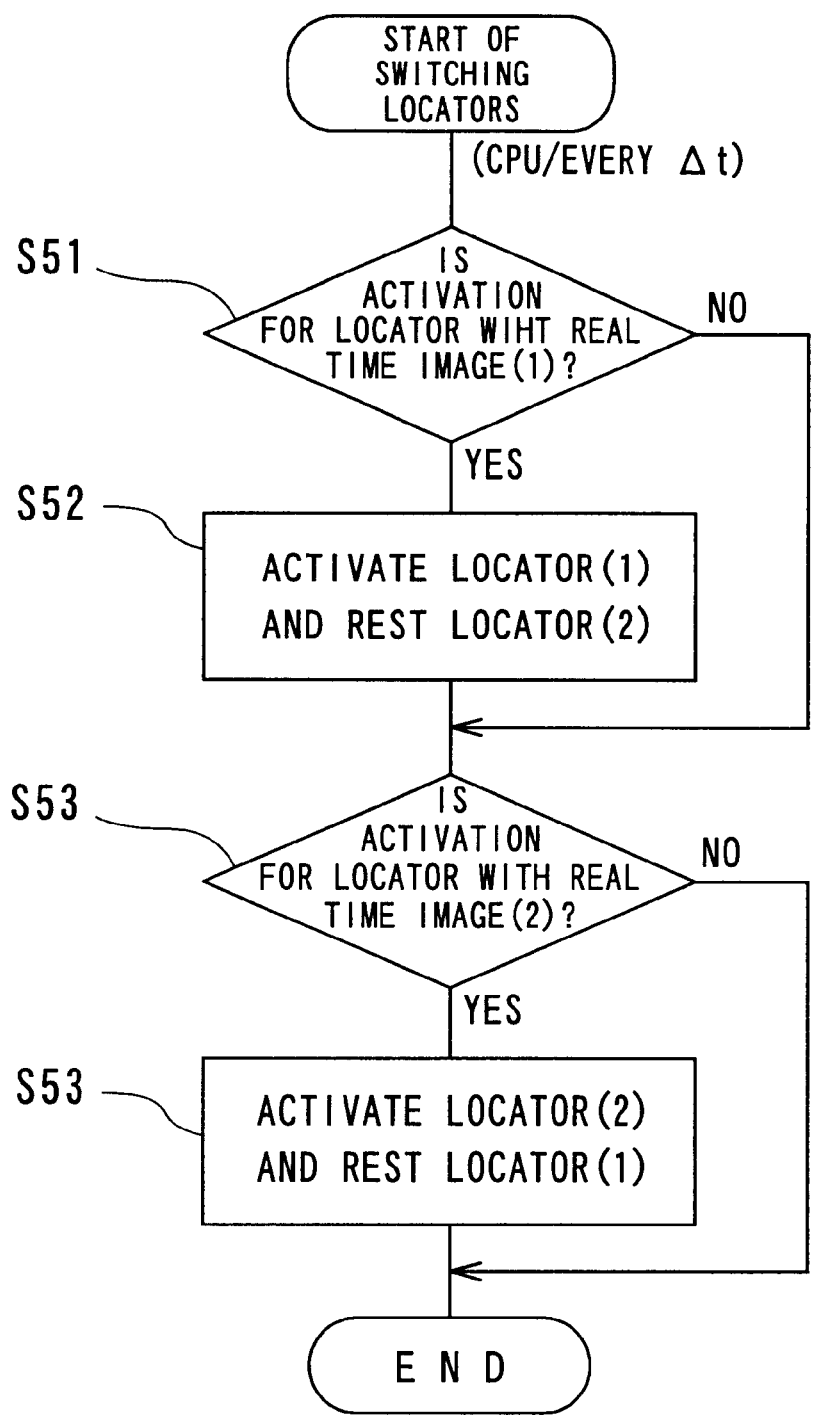
FIG. 24 is an outlined flowchart explaining the switching operation of the two locators.

Referring to FIGS. 23 to 24, a three-dimensional locating and displaying system according to the fourth embodiment will now be explained. This embodiment shows an example in which a plurality of locators (locating systems) are incorporated.

All the foregoing embodiments have explained a three-dimensional locating and displaying system in which only a single locator is incorporated. However, if a plurality of positions in anatomically complicated structures, such as a dissociated aorta, are observed at the same time, there are some cases that a single locator is unsatisfactory. The present embodiment will improve this situation.

Practically, as shown in FIG. 23, in addition to a pair of a scanned image display window 400A and a reference image display window 401A both of which are formed in a similar way to the above, another pair of a scanned image display window 400B and a reference image display window 401B are formed in the screen provided on the monitor 24 by the user interface 9. In any pair, images acquired in continuous scanning at a specified section (a section to be scanned) is displayed at the scanned image display window, while an image at an appropriate reference section is displayed at the reference image display window.

In this embodiment, by a single scanning means, realtime images at two sections, which are displayed at both the scanned image display windows 400A and 400B, are scanned, for example, alternately. Therefore, although the display rate at either window is reduced compared to a situation in which only one window is formed, it is possible to scan real-time images at different sections almost simultaneously.

Thus, in the sectional position display window 402, one locator (1): LC1 depending on a crossed two-section technique using a specified section SEC1A and a reference section SEC2A and the other locator (2): LC2 depending on a crossed two-section technique using a specified section SEC1B and a reference section SEC2B are formed, respectively.

The CPU 21 operates to switch control of these two locators (1) and (2), as shown in FIG. 24. The CPU 21 determines if one locator (1) on a real time image (1) displayed at one scanned image display window 400A should be activated or not based on operational information. In the case of YES, the locator (1) is started, but on one hand, the other locator (2) on a real time image (2) displayed at the other scanned image display window 400B is rested (steps S51 and S52). Then whether the locator (2) should be activated or not is determined on operational information. If the determination of YES is obtained, the locator (2) is started, while the locator (1) is rested (steps S53 and S54).

Repeating a series of these switching processes, for example, every minute constant interval Δt, allows both the locators (1) and (2) to be switched at any timing. By way of example, for observing complicated structure portions, such as a dissociated aorta, one locator (1) is first used to locate a desired one position (section to be set) in an interactive mode, then the other locator (2) is used to locate another desired position (section to be set) in a similar interactive mode. The images at the sections SEC1A and SEC1B defined by both the locators (1) and (2) enables real-time observation for different positions in an almost simultaneous manner.

Additionally, in this embodiment, three or more pairs each composed by both a real-time image and a reference image can be arranged, thereby three or more locators being provided. Further, through in the above embodiment, the locators (1) and (2) are constructed such that they are switched to each other when they are used, there can be provided an alternative that a plurality of windows 402 are formed separately and usable independently to each other.

By the three-dimensional locating and displaying systems described in the foregoing second to fourth embodiments, interactive, real-time locating toward three-dimensional data of an object to be scanned can be quickly performed with positional relationship being easy to understand, and an image at a located section can be observed.

As described above, the three-dimensional locating and displaying system can be effectively applied to locating for a region to be scanned (such as a sectional region) done by an MRI system which performs, for instance, continuous scanning. As a spatial relationship between an object and a region to be scanned is recognized steadily, a region to be scanned (section or others) can be set at a desired three-dimensional position in a quick, accurate, and easy manner. Additionally, a novel positioning and image-display technique that an image at the region can be displayed in real time for observation can be provided.

The present invention is not restricted to the constructions shown in the foregoing embodiments, but a person having ordinary skill in the art can create a variety of constructions adequately altered or deformed within the scope of the claims, and those modified constructions should be included in the present invention.

What we claim is:

1. A three-dimensional locating and displaying system comprising:
   region display means for displaying at least one region placed in a three-dimensional space set within an object;
   image display means for displaying at the region an image at a portion of the object corresponding to the region;
   change means for arbitrarily changing at least one of a direction and a position of the region in the three-dimensional space;
   wherein the region is a sectional region;
   wherein the region display means display both the sectional region and three-dimensional absolute coordinate axes set in the three-dimensional space;
   wherein the position change means changes a position of the sectional region for the continuous scanning in a predetermined stylized operation; and wherein the stylized operation uses, as a technique for specifying a move amount of the sectional region, a macro description with a function of time.

2. A three-dimensional locating and displaying system comprising:

region display means for displaying at least one region placed in a three-dimensional space set within an object;

image display means for displaying at the region an image at a portion of the object corresponding to the region;

change means for arbitrarily changing at least one of a direction and a position of the region in the three-dimensional space;

wherein the region is a sectional region;

wherein the region display means display both the sectional region and three-dimensional absolute coordinate axes set in the three-dimensional space;

wherein the position change means changes a position of the sectional region for the continuous scanning in a predetermined stylized operation; and wherein the position change means automatically sets, by image processing, a vector concerning a move direction of a position of the sectional region in the continuous scanning, thereby the position being determined automatically.

3. A three-dimensional display system comprising:

first image obtaining means for obtaining a first image at a first region set within an object;

second image obtaining means for repeatedly obtaining a second image at a second region set within the object so that the second image is repeatedly updated in response to a direction and a position of the second region currently specified;

change means for changing at least one of the direction and the position of the second region while the second image obtaining means obtains the second image; and display means for concurrently displaying both of the first and second images in a common three-dimensional coordinate system set to the object.

4. The system of claim 3 wherein each of the first and second regions is a volume region.

5. The system of claim 3 wherein the first and second regions are first and second sectional regions respectively.

6. The system of claim 5 wherein the display means includes means for displaying the first and second images on first and second display sections spatially corresponding to the sectional regions in the three-dimensional coordinate system and three-dimensional absolute coordinate axes set in the three-dimensional coordinate system.

7. The system of claim 6, wherein the first and second sectional regions are intersected with each other, and the first and second display sections used by the display means are intersected with each other in agreement with the intersection of the first and second sectional regions.

8. The system of claim 7 wherein the second image obtaining means includes scanning means for obtaining a two-dimensional image by continuously scanning the second sectional region of the object, and the display means has pasting means for pasting in realtime, as a current observation image, the continuously scanned two-dimensional image onto the second display section set in the three-dimensional coordinate system.

9. The system of claim 8 wherein the first image obtaining means includes further scanning means for obtaining a two-dimensional image by scanning the first sectional region of the object, and the display means includes further pasting means for pasting, as a reference image, the two-dimensional image scanned by the further scanning means onto the first display section set in the three-dimensional coordinate system.

10. The system of claim 8 wherein the change means includes:

specifying means for specifying a position in the three-dimensional coordinate system; and marker display means for displaying a marker in the three-dimensional coordinate system, the marker corresponding to the specified position.

11. The system of claim 10, wherein the marker display means display the marker in a different hue from the current observation image.

12. The system of claim 8 wherein the change means includes means for changing the position of the sectional region for the continuous scanning in a predetermined stylized operation.

13. The system of claim 12, wherein the stylized operation uses a macro description which is a function of time.

14. The system of claim 12, wherein the change means includes means for automatically setting a vector representing a move direction of the position of the sectional region required for the continuous scanning and means for determining the position automatically.

15. The system of claim 8 wherein the display means includes:

landmark display means for displaying in the three-dimensional coordinate system a landmark indicating a direction along which the two-dimensional image is observed.

16. The system of claim 6, wherein the change means includes means for delivering the sectional region to a desired three-dimensional position through a moving operation, a rotary operation and a further moving operation performed with the sectional region.

17. The system of claim 5, wherein the first and second sectional regions are intersected with each other.

18. The system of claim 3 wherein the second obtaining means includes:

recording means capable of recording three-dimensional positions of the second region in the three-dimensional coordinate system sequentially in time, calling means for calling the recorded three-dimensional positions, and wherein the display means includes replay means for replaying the second image corresponding to each of the called three-dimensional positions sequentially in time.

19. The system of claim 3 wherein the first obtaining means comprises:

specifying means for specifying a slice direction in which the object is scanned;

scanning means for producing a plurality of two-dimensional images by continuously scanning a volume region of the object containing the first region along the slice direction; and locating-image producing means for producing from the plurality of two-dimensional images a locating reference image of the volume region, the locating reference image being outlined into a three-dimensional image.

20. The system of claim 19, wherein:
the locating-image producing means extracts contours of the entity from a plurality of images and produces the reference image from data of the contours.

21. The system of claim 3 wherein the second obtaining means comprises:
signal detecting means for detecting a signal expressing physiological information about the object;
scanning means for scanning a volume region of the object containing the region in association with the signal of which time elapses; and
signal displaying means for displaying, together with the signal, a marker indicating that an image scanned by the scanning means corresponds to which timing in the signal, and
wherein the display means includes means for displaying the image scanned by the scanning means synchronously with the signal displayed by the signal display means.

22. The system of claim 21, wherein the signal expressing physiological information is an ECG signal of the object.

23. The system of claim 21, wherein both the signal display means and the image display means are formed to operate during either one period of the scanning performed by the scanning means and a replay operation performed after the scanning by the scanning means.

24. The system of claim 3, wherein the first and second regions are first and second sectional regions, respectively.

25. The system of claim 24, wherein the second image obtaining means includes scanning means for obtaining a two-dimensional image, as the second image, by continuously scanning the second sectional region of the object and
the display means has pasting means for pasting, in realtime, as a current observation image, the continuously scanned two-dimensional image onto a display section set in the three-dimensional coordinate system.

26. The system of claim 25, wherein the first image obtaining means includes further scanning means for obtaining a two-dimensional image by scanning the first sectional region of the object and
the display means has pasting means for pasting, as a reference image, the two-dimensional image scanned by the further scanning means onto a further display section set in the three-dimensional coordinate system.

27. The system of claim 26 comprising further image obtaining means for obtaining a further magnetic resonance image at a further region set within the object, wherein
the display means is formed to display both of the magnetic resonance image and the further magnetic resonance image in a common three-dimensional coordinate system set to the object.

28. The system of claim 27 wherein the further region and the region are first and second sectional regions, respectively.

29. The system of claim 28 wherein the display means includes means for displaying the further magnetic resonance image and the magnetic resonance image on first and second display sections spatially corresponding to the first and second sectional regions in the three-dimensional coordinate system and three-dimensional absolute coordinate axes set in the three-dimensional system.

30. The system of claim 29, wherein the first and second regions are intersected with each other, and the first and second display sections used by the display means are intersected with each other in agreement with the intersection of the first and second sectional regions.

31. The system of claim 30 wherein the image obtaining means includes scanning means for obtaining a two-dimensional image by continuously scanning the second sectional region of the object, and
the display means has pasting means for pasting in real time, as a current observation image, the continuously scanned two-dimensional image onto the second display section set in the three-dimensional coordinate system.

32. The system of claim 31 wherein the further image obtaining means includes scanning means for obtaining a two-dimensional image by scanning the first sectional region of the object, and
the display means further includes reference image display means for pasting, as a reference image, the two-dimensional image scanned by the scanning means of the further image obtaining means onto the first display section set in the three-dimensional coordinate system.

33. A magnetic resonance imaging system comprising:
first image obtaining means for obtaining a first magnetic resonance image at a first region set within the object;
second image obtaining means for repeatedly obtaining a second magnetic resonance image at a second region set within the object so that the second magnetic resonance image is repeatedly updated in response to a direction and a position of the second region currently specified;
change means for changing at least one of the direction and the position of the second region while the second image obtaining means obtains the second image; and
displaying means for concurrently displaying both of the first and second magnetic resonance images in a common three-dimensional coordinate system set to the object.

34. The system of claim 33 wherein the first and the second regions are first and second sectional regions, respectively.

35. The system of claim 34 wherein the display means includes means for displaying the first magnetic resonance image and the second magnetic resonance image on first and second display sections spatially corresponding to the first and second sectional regions in the three-dimensional coordinate system and three-dimensional absolute coordinate axes set in the three-dimensional coordinate system.

36. The system of claim 35 wherein the first and second sectional regions are intersected with each other, and the first and second display sections used by the display means are intersected with each other in agreement with the intersection of the first and second sectional regions.

37. The system of claim 36 wherein the second image obtaining means includes scanning means for obtaining a two-dimensional magnetic resonance image by continuously scanning the second sectional region of the object, and
the display means has pasting means for pasting in real time, as a current observation image, the continuously scanned two-dimensional magnetic resonance image onto the second display section set in the three-dimensional coordinate system.

38. The system of claim 37 wherein the first image obtaining means includes scanning means for obtaining a two-dimensional magnetic resonance image by scanning the first sectional region of the object, and
the display means further includes reference image display means for pasting, as a reference image, the two-dimensional magnetic resonance image scanned by the scanning means of the first image obtaining means onto the first display section set in the three-dimensional coordinate system.

39. A method of displaying an image of an object, comprising the steps of:

obtaining, as the image, a first image at a first region set within the object and a second image at a second region set within the object, at least one of a direction and a position of the second region being able to be changed during obtaining the magnetic resonance image and the second image being repeatedly obtained so as to be updated in response to the direction and the position of the second region currently specified; and concurrently displaying both of the first and second images in a common three-dimensional coordinate system set to the object.

40. The method of claim 39 wherein the first and second regions are first and second sectional regions, respectively.

41. The method of claim 40 wherein, in the display step, the first image and the second image are respectively displayed on first and second display sections spatially corresponding to the first and second sectional regions in the three-dimensional coordinate system and three-dimensional absolute coordinate axes set in the three-dimensional coordinate system.

42. The method of claim 41 wherein the first and second sectional regions are intersected with each other, and the first and second display sections are intersected with each other in agreement with the intersection of the first and second sectional regions.

43. The method of claim 42 wherein the image obtaining step includes a step of obtaining a two-dimensional image by continuously scanning the second sectional region of the object, and the display step includes a step of pasting in real time, as a current observation image, the continuously scanned two-dimensional image onto the second display section set in the three-dimensional coordinate system.

44. The method of claim 43 wherein the image obtaining step includes a step of obtaining a two-dimensional image by scanning the first sectional region of the object, and the display step further includes a step of pasting, as a reference image, the two-dimensional image scanned in the image obtaining step onto the first display section set in the three-dimensional coordinate system.

45. A method of displaying a magnetic resonance image of an object, comprising the steps of:

obtaining the magnetic resonance image at an arbitrary region set within the object, at least one of a direction and a position of the region being able to be changed during obtaining the magnetic resonance image and the magnetic resonance image being repeatedly obtained so as to be updated in response to the direction and the position of the region currently specified; and displaying the magnetic resonance image in a three-dimensional coordinate system set to the object.

46. A method of magnetic resonance imaging, comprising the steps of:

obtaining both of a first image at a first region set within an object and a second image at a second region set within the object, at least one of a direction and a position of the second region being able to be changed during obtaining the magnetic resonance image and the second image being repeatedly obtained so as to be updated in response to the direction and the position of the second region currently specified; and concurrently display both of the first and second images in a common three-dimensional coordinate system set to the object.

47. The method of claim 46 wherein the first and the second regions are first and second sectional regions, respectively.

48. The method of claim 47 wherein, in the display step, the first image and the second image are respectively displayed on first and second display sections spatially corresponding to the first and second sectional regions in the three-dimensional coordinate system and three-dimensional absolute coordinate axes set in the three-dimensional coordinate system.

49. The method of claim 48 wherein the first and second sectional regions are intersected with each other, and the first and second display sections are intersected with each other in agreement with the intersection of the first and second sectional regions.

50. The method of claim 49 wherein the image obtaining step includes a step of obtaining a two-dimensional magnetic resonance image by continuously scanning the second sectional region of the object, and the display step includes a step of pasting in real time, as a current observation image, the continuously scanned two-dimensional magnetic resonance image onto the second display section set in the three-dimensional coordinate system.

51. The method of claim 50 wherein the image obtaining step includes a step of obtaining a two-dimensional magnetic resonance image by scanning the first sectional region of the object, and the display step further includes a step of pasting, as a reference image, the two-dimensional magnetic resonance image scanned in the image obtaining step onto the first display section set in the three-dimensional coordinate system.

* * * * *